United States Patent [19]
Longway et al.

[11] Patent Number: 5,563,834
[45] Date of Patent: Oct. 8, 1996

[54] MULTIPORT MEMORY AND METHOD

[75] Inventors: Charles W. T. Longway; William R. Young, both of Palm Bay, Fla.

[73] Assignee: Harris Corporation, Melbourne, Fla.

[21] Appl. No.: 345,689

[22] Filed: Nov. 21, 1994

Related U.S. Application Data

[62] Division of Ser. No. 930,930, Aug. 14, 1992, Pat. No. 5,440,506.

[51] Int. Cl.$^6$ ........................................................ G11C 7/00
[52] U.S. Cl. .................... 365/203; 365/233; 365/230.05; 365/207
[58] Field of Search ..................................... 365/203, 154, 365/156, 233, 207, 230.05

[56] References Cited

U.S. PATENT DOCUMENTS 5,060,189  10/1991  Ota ............................................ 365/69
5,307,322   4/1994  Usami et al. ........................ 365/154 X Primary Examiner—David C. Nelms
Assistant Examiner—Huan Hoang
Attorney, Agent, or Firm—Rogers & Killeen

[57] ABSTRACT

Integrated circuit memory with bitlines which cross each other in multiple place for symmetric capacitives coupling. Also read only memory with differential sense amplifier with an input to each half array of cells. Bits are stored complementarily in the two halves.

20 Claims, 27 Drawing Sheets

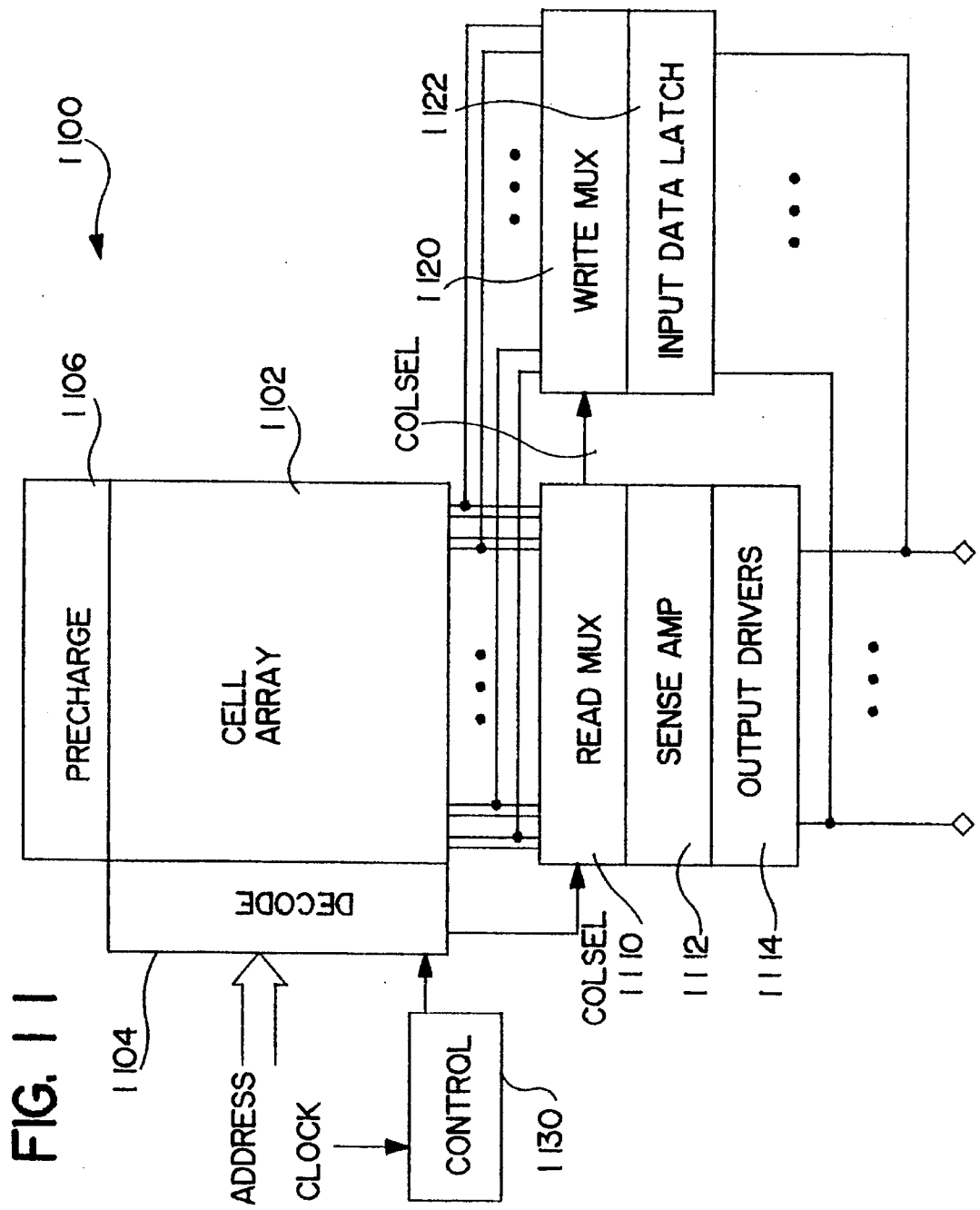

MULTIPORT MEMORY AND METHOD

CROSS-REFERENCE TO RELATED APPLICATIONS

This is a division of application Ser. No. 07/930,930, filed Aug. 14, 1992, now U.S. Pat. No. 5,440,506.

BACKGROUND AND SUMMARY OF THE INVENTIONS

The present invention relates to electronic devices, and, more particularly, to semiconductor memory circuits.

Memory Circuits

As is well known, digital computers use digital semiconductor primary memory and typically also have digital magnetic secondary memory. The primary memory stores current data and programs, and the secondary memory provides bulk storage. But other electronic systems also use memory in various ways. For example, in communication systems the use of frequency division multiplexing (FDM) to simultaneously broadcast differing information signals from several sources in a single locale requires a receiver be able to extract a desired information signal from a received broadband of simultaneous broadcasts. See schematic FIG. 1. Such extraction typically includes sampling of the received signal to form a digital signal (A/D converter 106) and then digital signal processing (digital down converter 108) to recover the desired information signal. The digital signal processing will use digital filtering following a mixing down (down conversion by the selected carrier frequency). The digital filtering often requires multiplications of filter coefficients with data samples, and typically the filter coefficients are stored in semiconductor read only memory (ROM) and the data samples temporarily stored in semiconductor random access memory (RAM). FIG. 2 illustrates a finite impulse response filter incorporating ROM 202 storing filter coefficients and dual port RAM 204 storing the data samples. These memories must be both fast due to high communication frequencies and low power due to the portable nature of much communication systems,

Features

The present invention provides semiconductor memory with differential sensing and low capacitance layouts in both RAM and ROM for speed and low power.

It also provides self timed interface which allows memories to operate at optimum speed without requiring on chip glue logic to interface with the rest of a design.

BRIEF DESCRIPTION OF THE DRAWINGS

The present invention will be described with reference to the accompanying drawings, which are schematic for clarity:

FIG. 10a is a ROM memory cell layout showing metal 1, metal 2, via 1, and via 2 layers;

FIG. 10b is a ROM memory cell layer showing metal 1, via 1, poly and diffusion layers;

FIG. 10c–10d are ROM memory cell layouts showing all layers;

FIG. 11 is a block diagram of a preferred embodiment dual port RAM;

DESCRIPTION OF THE PREFERRED EMBODIMENTS

Figure 1:
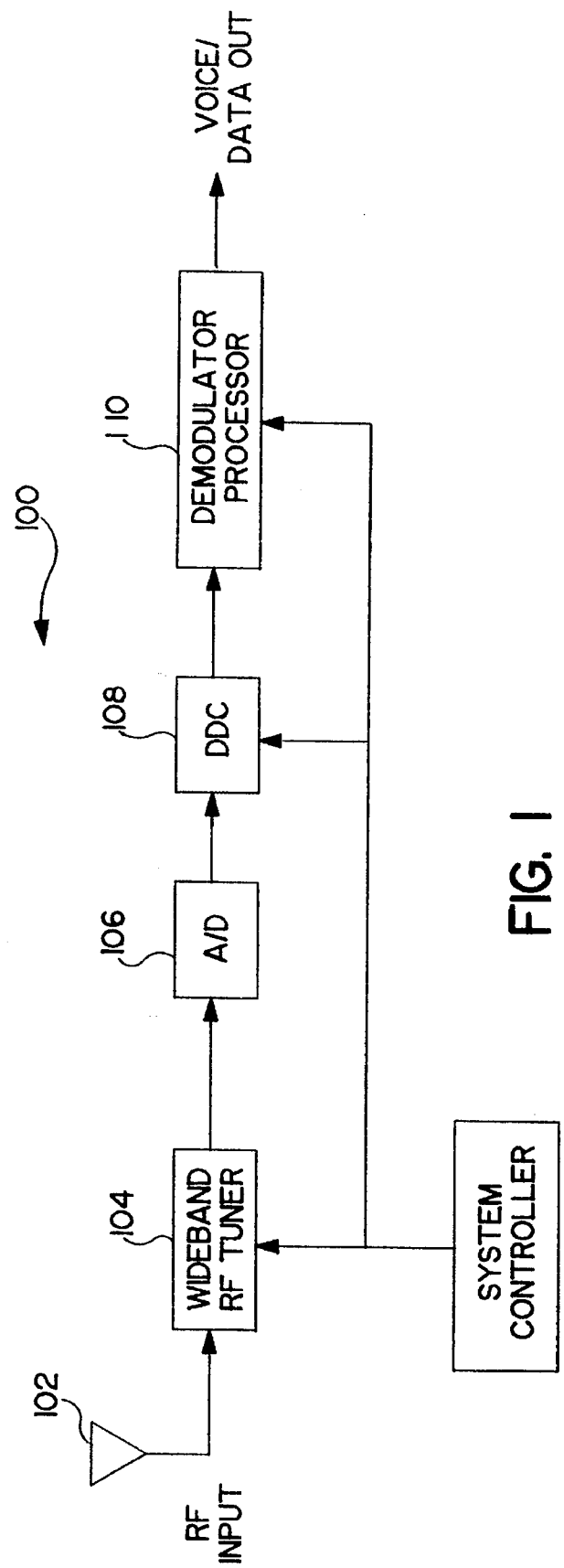
FIG. 1 illustrates a communication system application.
Figure 2:
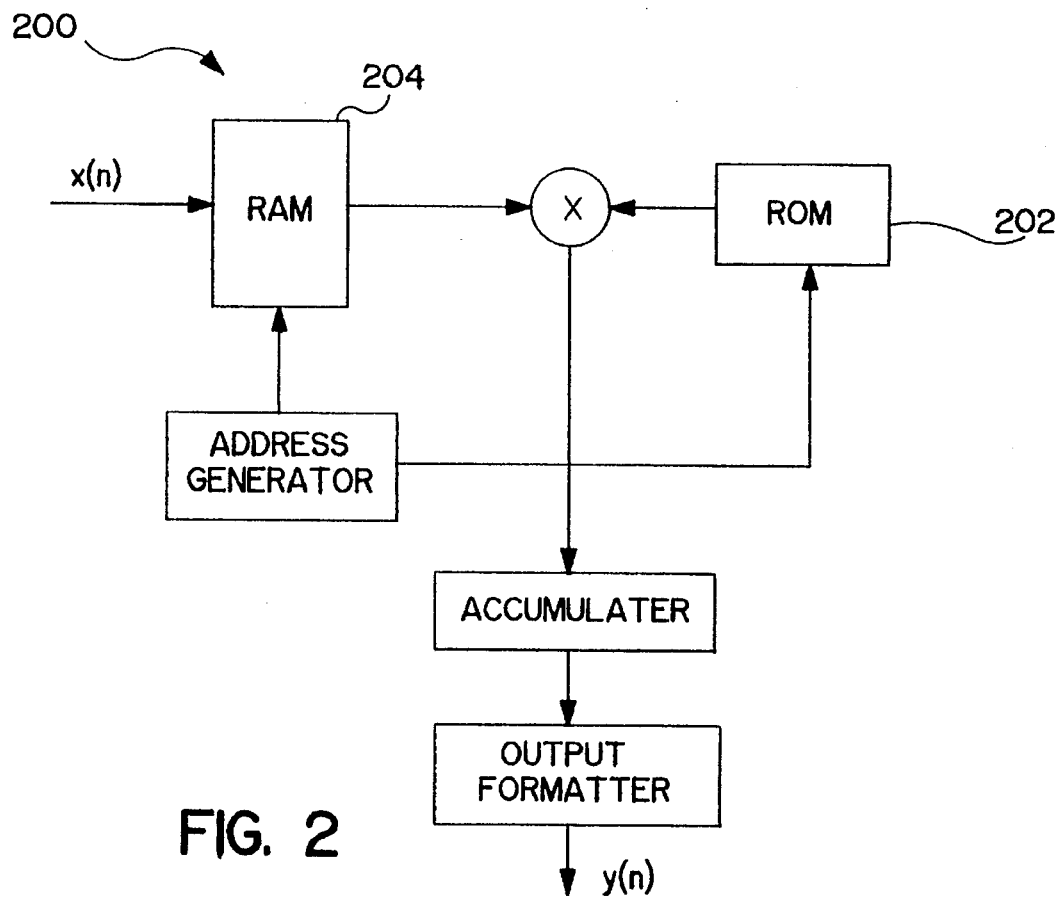
FIG. 2 shows a filter with RAM and ROM.
Figure 3A:
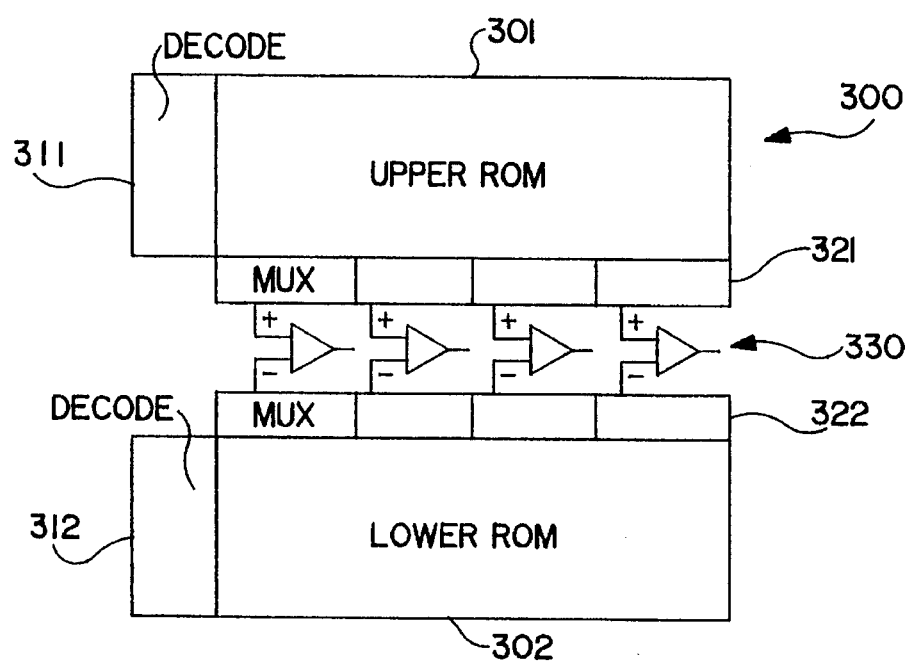
FIGS. 3a–b are functional block diagrams of a first preferred embodiment differential ROM.

FIG. 3a is a functional block circuit diagram of a first preferred embodiment read only memory (ROM), generally denoted by reference numeral 300, which includes upper ROM cells 301, lower ROM cells 302, address decoder 311 for upper ROM 301, address decoder 312 for lower ROM 302, column multiplexers 321 and 322, and differential sense amplifiers 330. As described in detail in the following, ROM 300 operates with differential sensing in that sense amplifiers 330 are differential amplifiers with their positive inputs coupled to columns in upper ROM 301 and their negative inputs coupled to columns in lower ROM 302. ROM 300 may be a portion of an integrated circuit containing other circuits sharing power and ground connections. The columns each have a reference cell, so if a cell in upper ROM 301 is to be read, then the reference cell in the corresponding column in lower ROM 302 provides the complementary input to the sense amplifier. FIG. 3a also shows four sense amplifiers 330, so ROM 300 could be set up to read out four bits in parallel. Each sense amplifier 330 is multiplexed to a number of columns by column multiplexers 321 and 322.

Figure 3B:
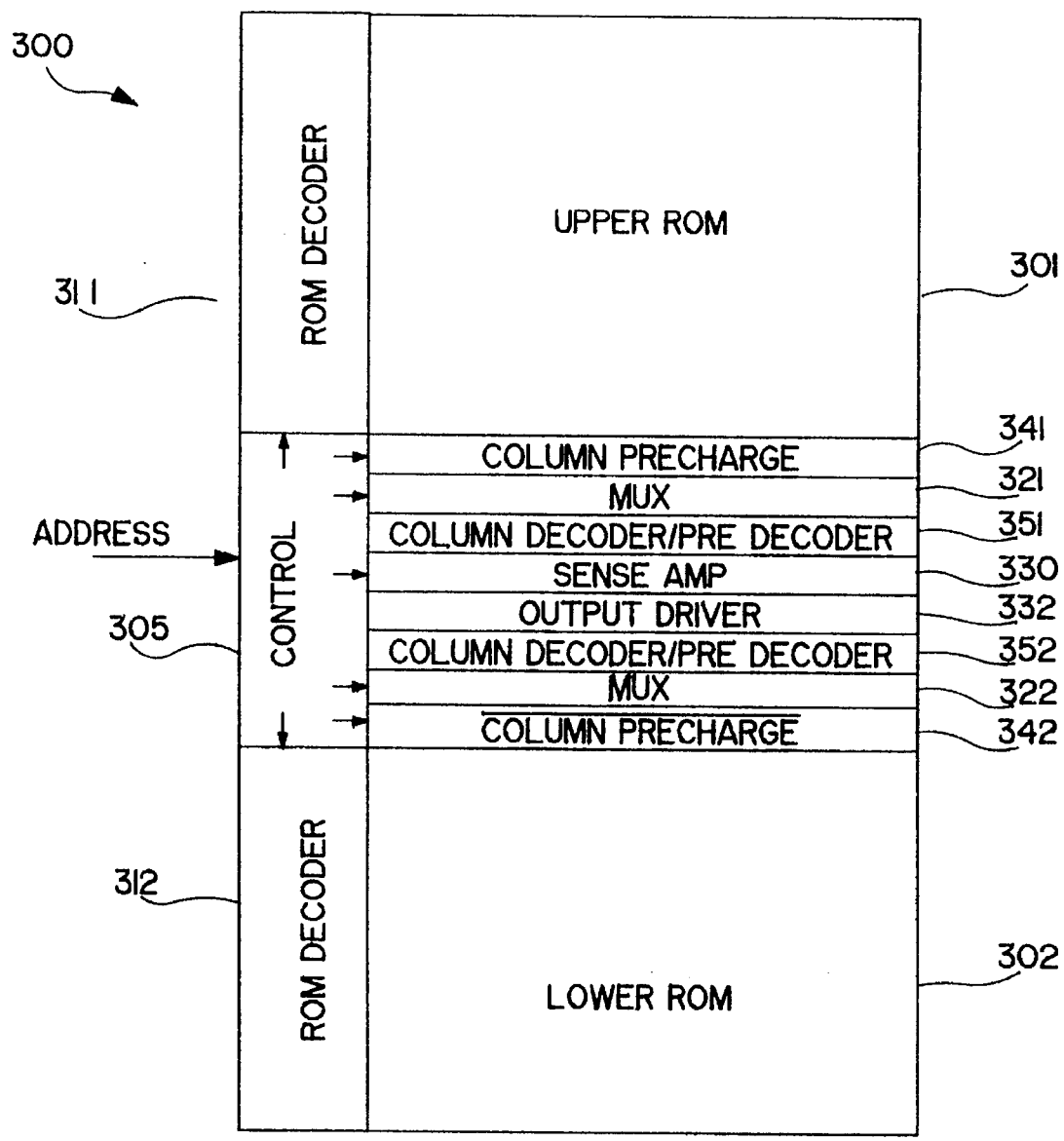

FIG. 3b provides another functional circuit diagram of ROM 300 with further details: control circuitry 305 which generates timing and partitions an incoming address into row and column bits, sense amplifier output drivers 332, column prechargers 341–342, and column decoders 351–352.

Figure 4A:
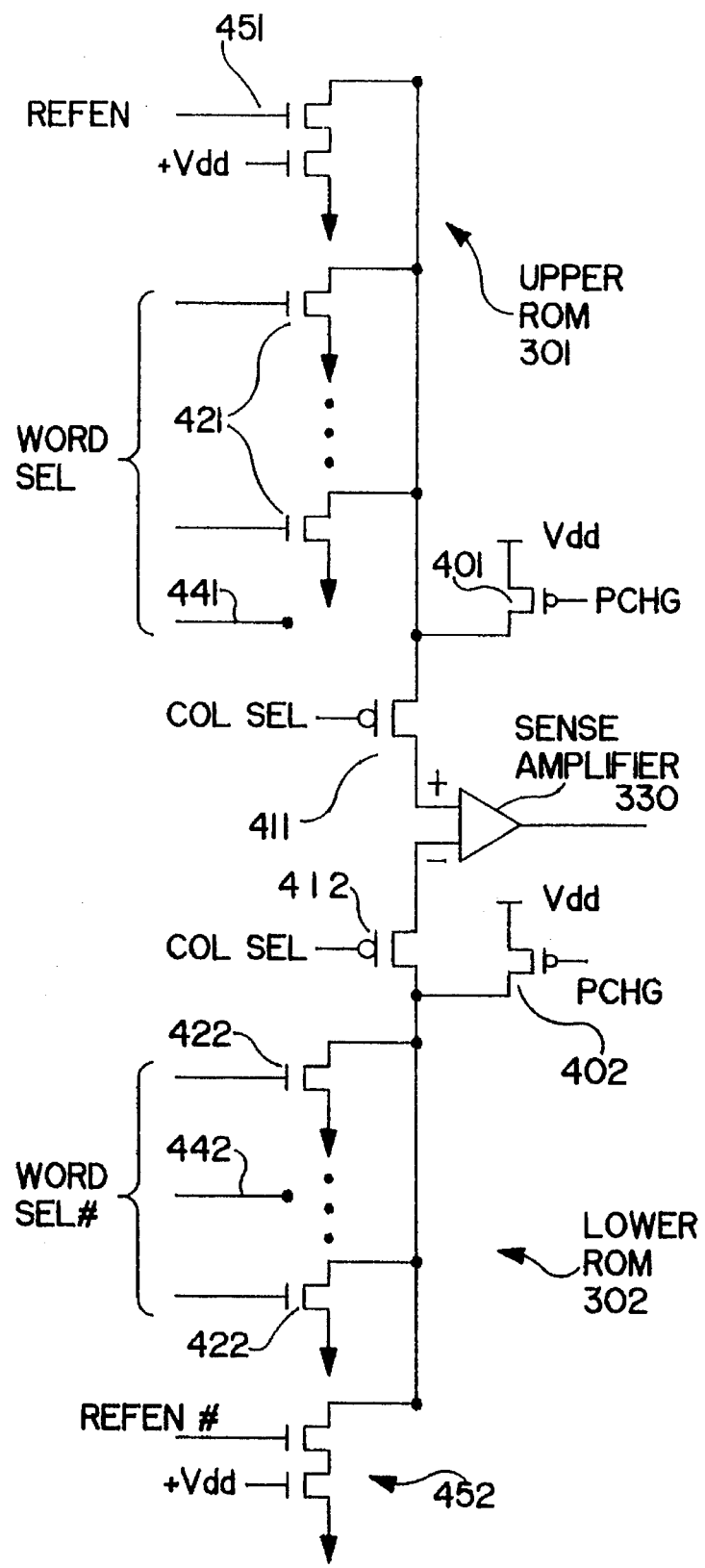
FIGS. 4a–b schematically show a column and power distribution in the first preferred embodiment ROM.

ROM 300 provides high speed, low power sensing by using a differential sense amplifier as is typical in a RAM rather than the typical single-ended sense amplifier of a ROM. FIG. 4a schematically details a single column and cells from upper ROM 301 and lower ROM 302 with sense amplifier 330 coupled to the column ends; multiplexing is omitted for clarity. The columns include precharge pullup PMOS devices 401–402, column select PMOS pass devices 411–412, a number of cell NMOS devices 421–422, and reference cells 451–452 each made of an NMOS device in series with a second NMOS device which has its gate tied to the supply voltage Vdd. In upper ROM 301, a cell stores a 0 by the presence of an NMOS device 421 connecting the column to ground and stores a 1 by the absence of an NMOS device indicated by the line 441 terminating without an NMOS 421. In lower ROM 302 a cell stores a 0 by the absence of an NMOS device such as line 442 and stores a 1 by the presence of an NMOS device 422. This asymmetry reflects the sense amplifier's positive and negative inputs with the positive input connecting to the upper ROM 301 column and the negative input connecting to the lower ROM 302 column. Because the reference cells have two NMOS devices in series, the reference cells have only half of the drive current of the other cells with NMOS devices present: all of the cell NMOS devices have the same gate width to length ratio.

Figure 5A:
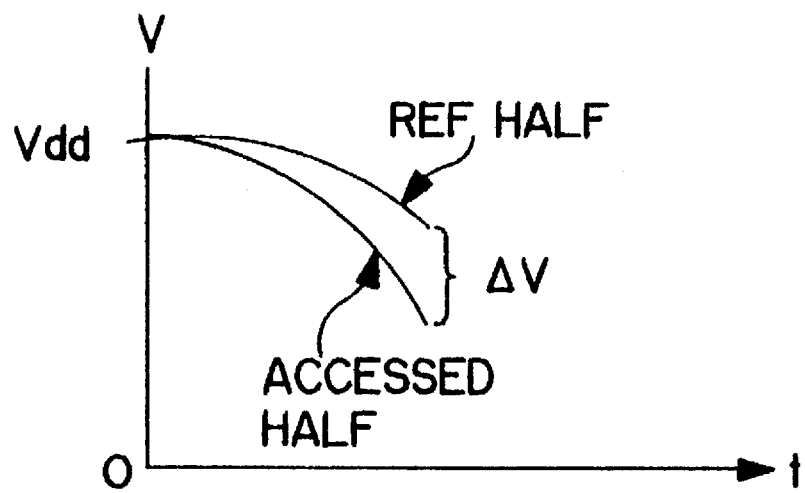
FIGS. 5a–5b show sensing in the first preferred embodiment ROM.
Figure 5B:
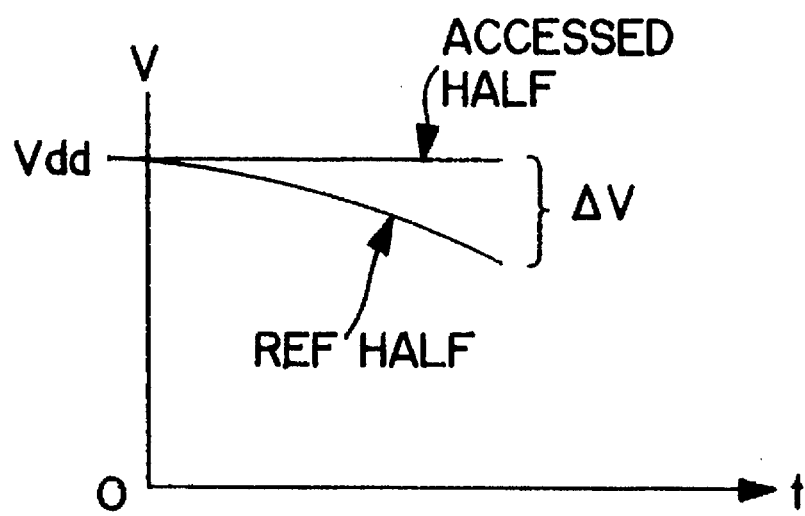

FIGS. 5a–b heuristically illustrates the operation of sense amplifiers 330 in ROM 300 as follows. First, the columns are precharged to Vdd by PCHG going low turning on PMOS pull ups 401–402 in each column. During this precharging the column select PMOS 411–412 are turned off to isolate the columns from the sense amplifiers. Next, the appropriate column selects are turned on and a cell is accessed on one column by driving the cell's wordline high, and simultaneously turning on the reference cell in the other column. In particular, if the signal Word_Sel goes high to access an upper ROM cell, then signal Refen# (# denotes complement) goes high to turn on reference cell 452 in lower ROM; and if Word_Sel# goes high to access a cell in lower ROM, then Refen goes high to turn on reference cell 451 in upper ROM. If the cell accessed has an NMOS device present (storing a 0 in the upper ROM or a 1 in the lower ROM), then voltage on the column containing the accessed cell will drop from Vdd towards ground when the NMOS device (421 or 422) turns on. Similarly, the voltage of the other column will also drop from Vdd towards ground as the reference cell (451 or 452) turns on. Now the voltage of the column with the accessed cell will drop at twice the rate that the voltage on the other column drops due to the reference cell having only one half of the drive current. FIG. 5a shows the two column voltages droppings and the voltage differential ΔV seen by sense amplifier 330.

Conversely, if the accessed cell does not have an NMOS device present (storing a 1 in the upper ROM or a 0 in the lower ROM), then the voltage on the column containing the accessed cell does not drop toward ground because nothing turns on to pull it down. But the reference cell in the other column turns on and pulls the voltage towards ground; see FIG. 5b again showing the differential voltage ΔV seen by sense amplifier 330 but with opposite polarity from the case of FIG. 5a.

The two rows of reference cells have NMOS devices in every column, whereas the rows of cells storing data only have NMOS devices in the columns with the corresponding bit (0 in upper ROM, 1 in lower ROM) and on the average only load the corresponding wordline with half the device capacitance. (The parasite capacitance is approximately equal.) Thus the reference rows are a worst case for row turn-on timing, and the sense amplifier strobe is driven by the reference cell row wordline rise. Also, the reference cells 451–452 are placed at the end of each column away from the sense amplifier, and the Vdd power connections (precharge pull up PMOS devices 401–402) are placed near the sense amplifier 330 in order to avoid any parasitic differential voltages. That is, FIG. 4a correctly portrays the device ordering along a column.

Figure 4B:
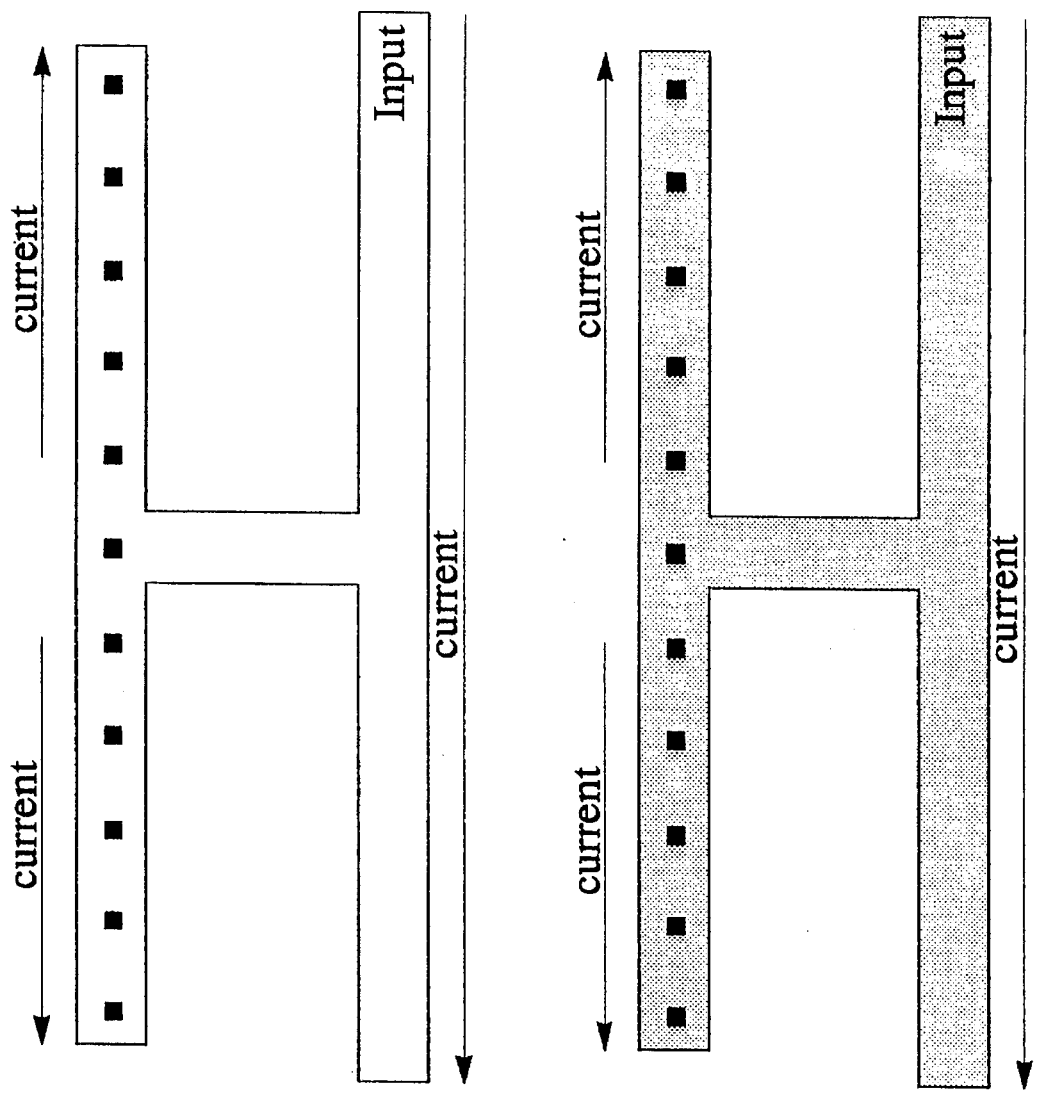

FIG. 4b further illustrates the power distribution in ROM 300. In particular, in a differential ROM a bit and its complement (reference column) are on opposite sides of the memory array. To avoid power supply voltage drops, which may affect the differential inputs to the sense amplifier, ROM 300 distributes the power in such a way that the same voltage is applied to similar circuits on both halves of the column logic and memory array. The "H" shaped power distribution shown in FIG. 4b is repeated every sixteen columns. The black squares indicate contacts for distribution to other layers for local power distribution. Because power flows from the center of the "H" to symmetric distribution points the amount of current flowing through the input of the "H" has no differential affect on what voltage is distributed. This allows power to flow over the memory array and into other logic on an integrated circuit which includes the memory array as a subcircuit without concern for voltage drops across the array. The shaded supply is Vdd and the unshaded supply is ground. The "H" pattern is continuous in third level metal and the distribution to ground through the array is in first level metal connected to the distribution side of the "H" pattern.

Figure 6A:
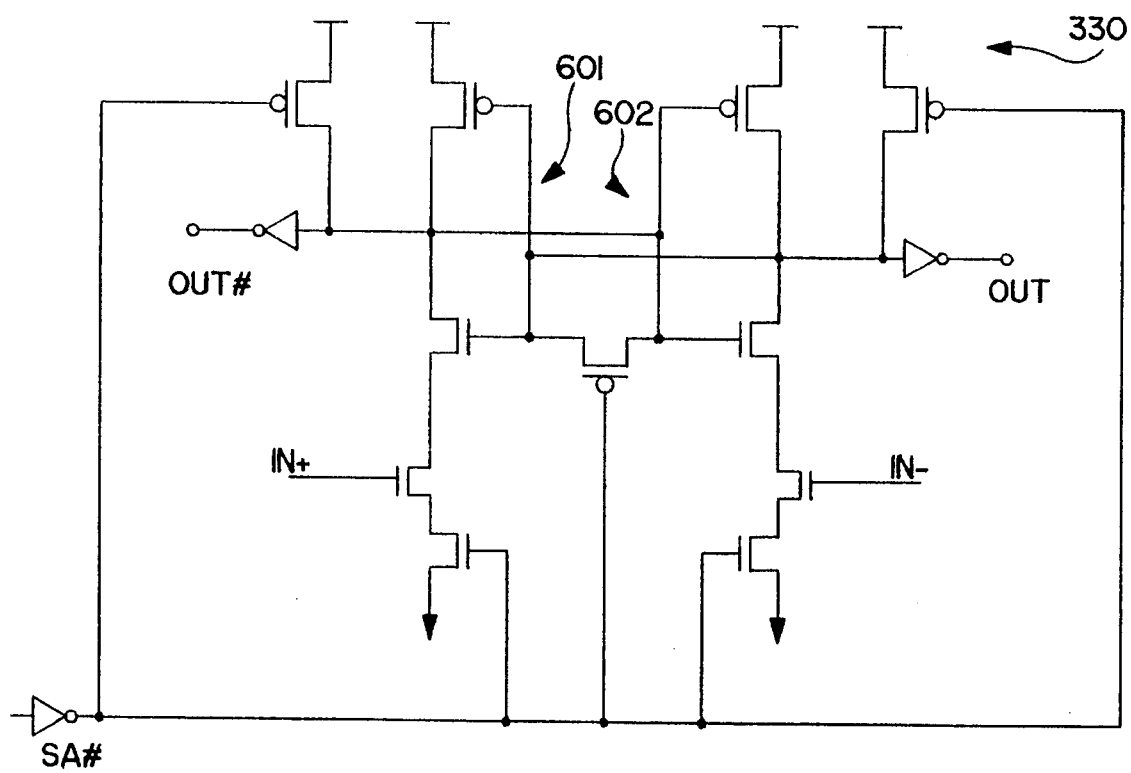
FIGS. 6a–6b are schematic circuit diagrams for the sense amplifier with an output buffer of the first preferred embodiment ROM.
Figure 6B:
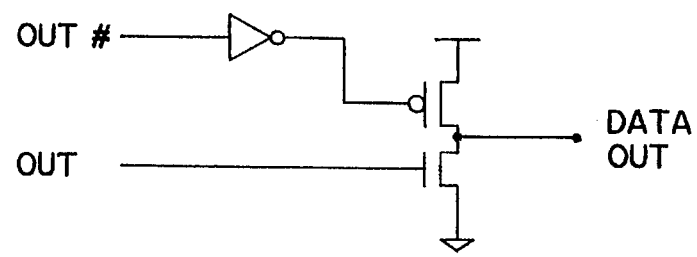
Figure 7:
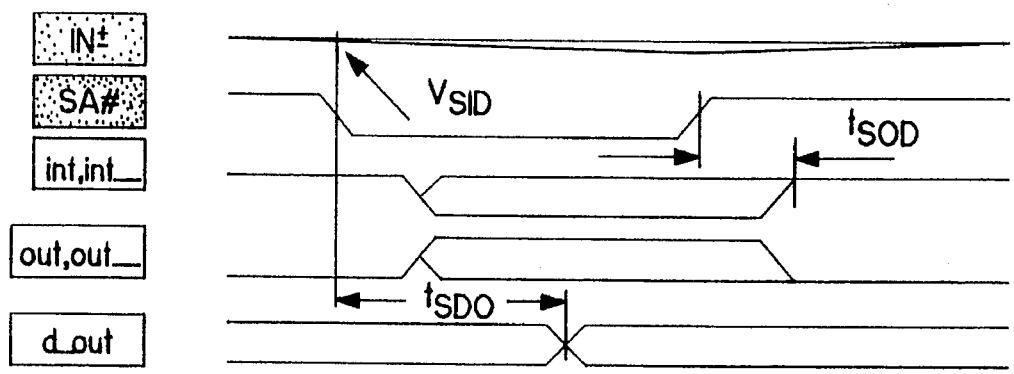
FIG. 7 is a ROM sense amplifier timing diagram.

FIG. 6a schematically shows sense amplifier 330 with an output buffer in FIG. 6b. Sense amplifier 330 uses crosscoupled inverters 601–602 to amplify the differential input signals at IN+ and IN−. Sense amplifier strobe signal SA# goes high to precharge sense amplifier 330 and goes low to activate it. FIG. 7 is a timing diagram illustrating the operation of sense amplifier 330. The top panel of FIG. 7 shows the voltage at one of the differential inputs IN+, IN−; the second panel is the sense amplifier strobe signal SA# which goes low to activate the sense amplifier. The third panel shows the voltage at the inputs/outputs of the crosscoupled inverters 601–602 which latch the bit being read. The fourth panel shows the sense amplifier outputs to the output buffer, and the bottom panel shows the data output of the output buffer. Note that SA# turns on the sense amplifier when the columns (inputs IN+, IN−) have only partially discharged; this reduces the power consumed in reading and precharging.

Figure 8:
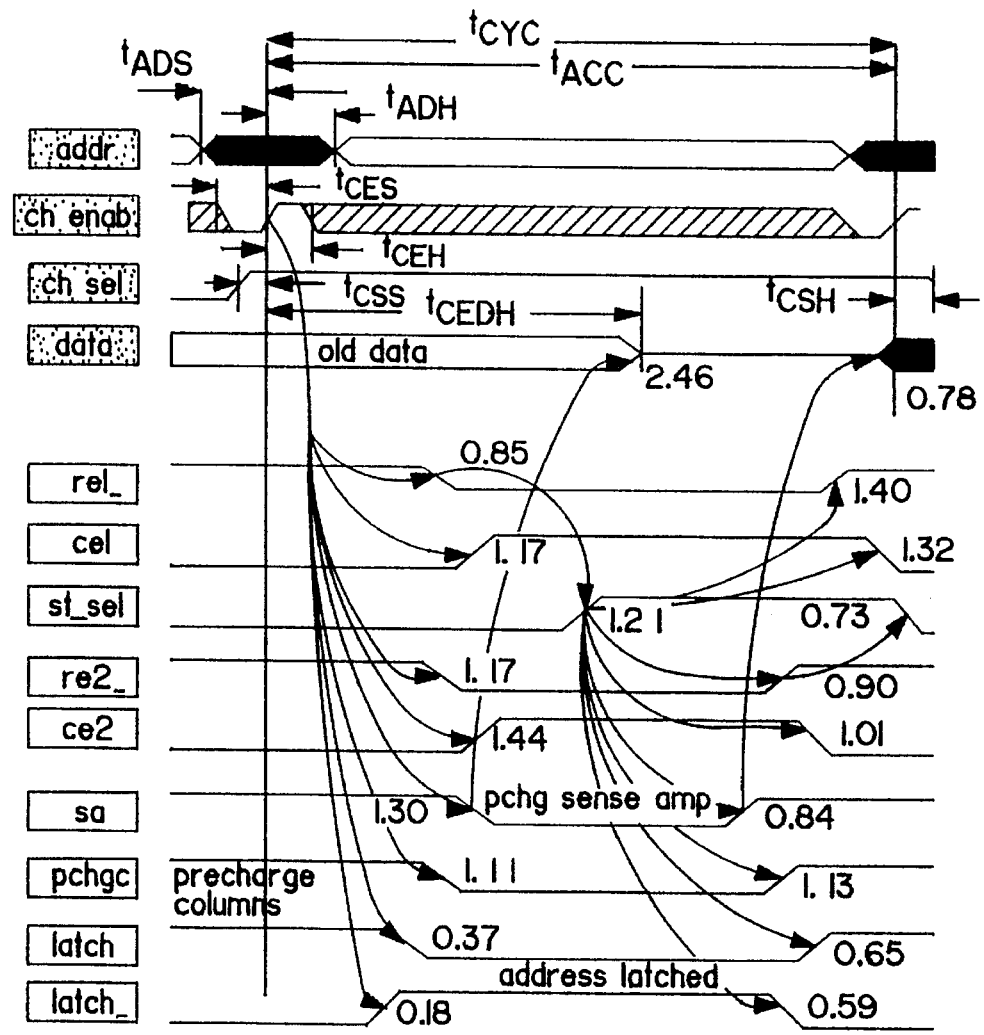
FIG. 8 is the top level timing diagram.

FIG. 8 is a timing diagram illustrating the overall operation of ROM 300. A read cycle starts when the Chip Enable signal goes high (second panel of FIG. 8). The address registers latch the values that are at the address inputs when the cycle starts; the top panel shows that the address must be valid when the cycle starts. Also, the third panel shows the Chip Select signal high to permit access. The least significant bit of row address is used to select which of upper ROM and lower ROM should be used as the reference cell. The state of Chip Enable is self latched. During a cycle signal Self-timed Row Select (seventh panel) drives Sense Amplifier Strobe (SA, tenth panel) to activate sense amplifier 330 and put the accessed bit out at Data (fourth panel). The row and column drivers (Word_Sel and Col_Sel in FIG. 4 and panels 5–6 and 8–9 in FIG. 8) are shut down at the same time that sense amplifier 330 is activated. The Self-Timed Row Select signal (panel 7 in FIG. 8) resets the latched state of Chip Enable which in turn opens up the address latch (bottom two panels). Subsequently, the column and row logic are precharged (eleventh panel).

Figure 9:
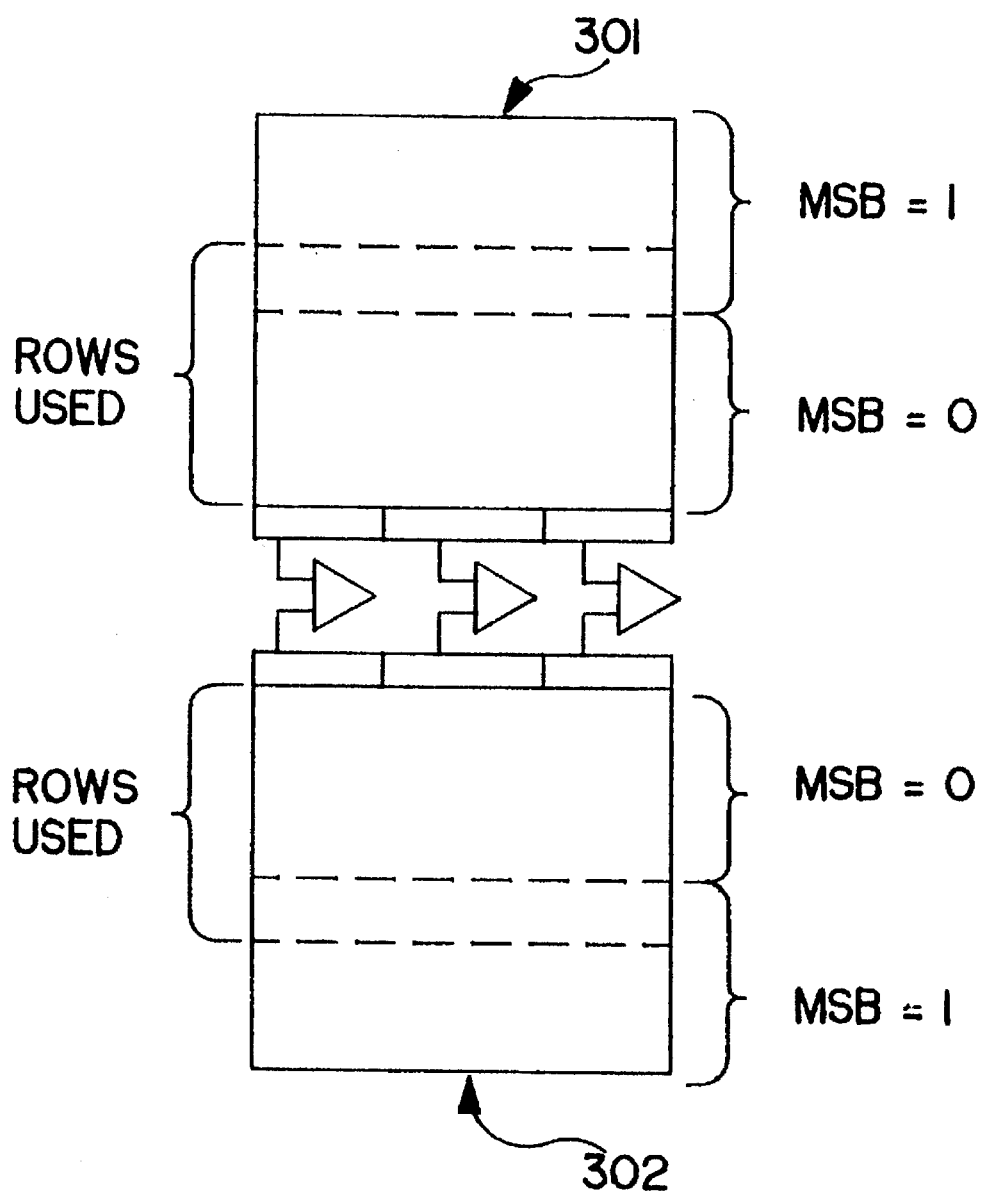
FIG. 9 illustrate storage with incomplete usage of address space.

FIG. 9 shows ROM 300 when not all of the address space is used for storage. In all cases the row corresponding to a "1" in the most significant bit of the row address is disposed symmetrically from bottom to top and top to bottom in 301 and 302 respectively. When the number of words used is less than $2^{MSB(row)}$ then MSB=1 will address the same number of words on each side of the array (301, 302) but less than $2^{MSB(row)-1}$ total words. In this case, the most significant bit (MSB) of the address is symmetrically disposed to balance the column loadings. The least significant bit of row space (LSB) is used to determine upper ROM versus lower ROM.

Figure 10A:
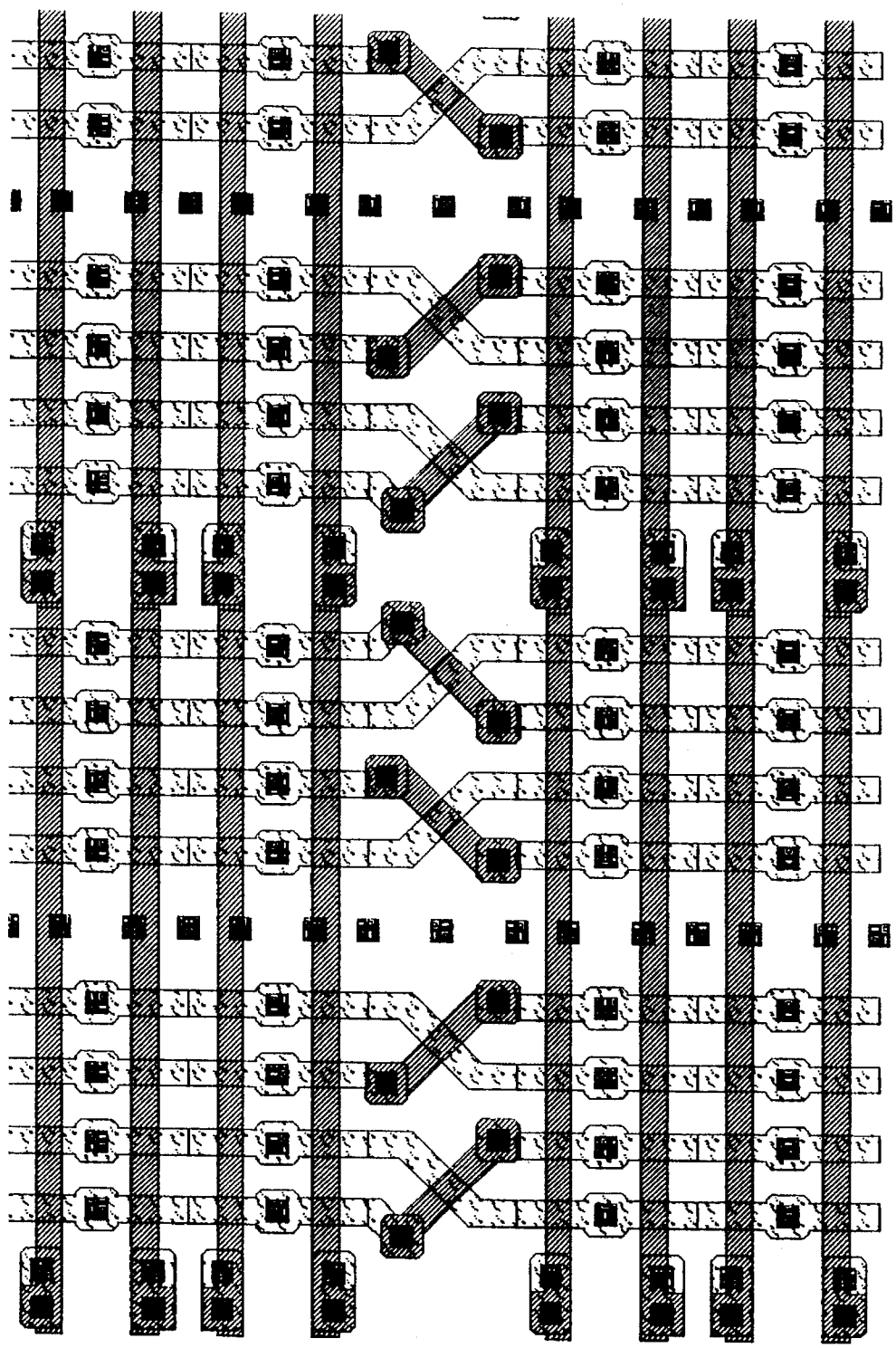
FIGS. 10a–d are ROM memory cell layouts.
Figure 10B:
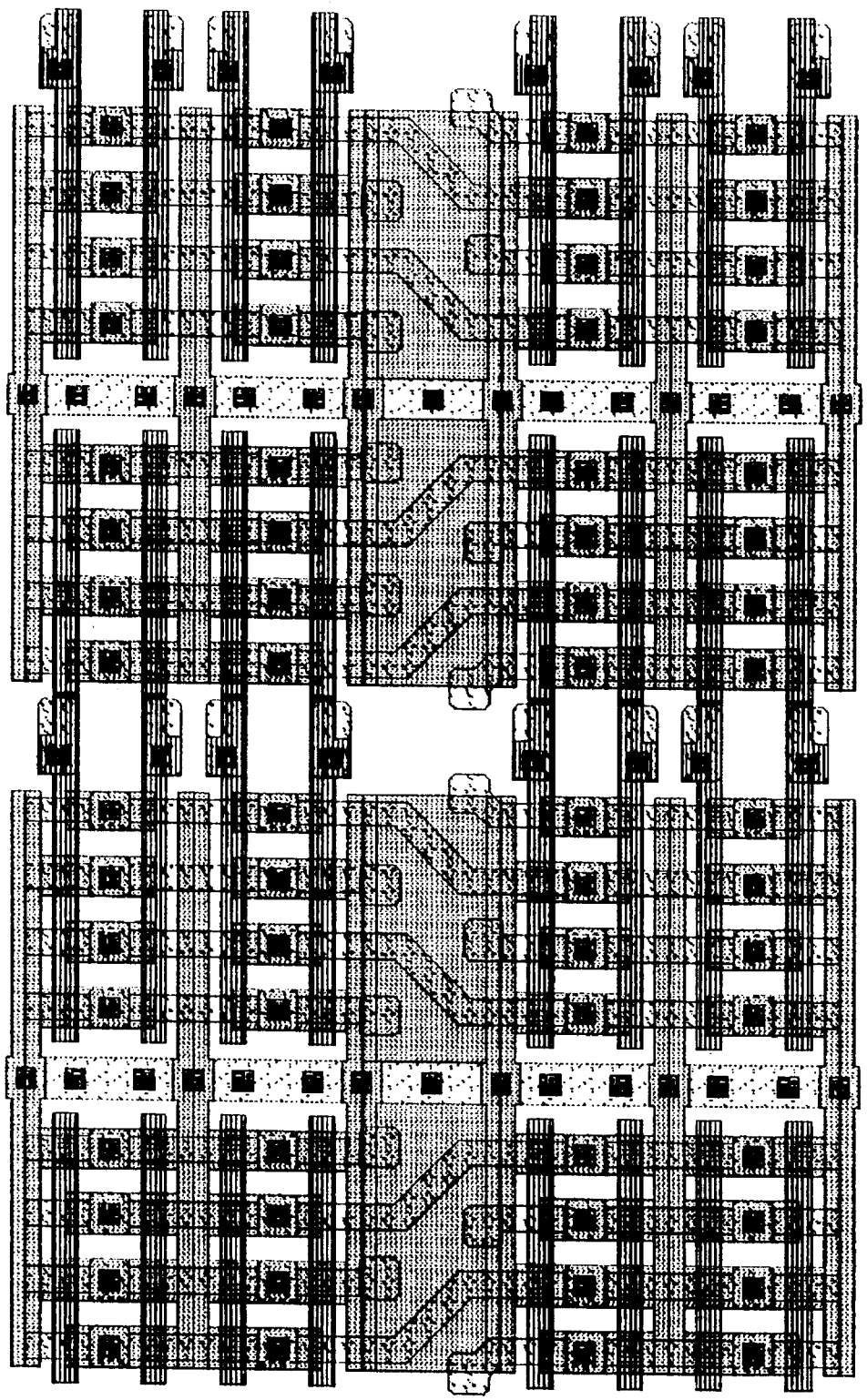
Figure 10C:
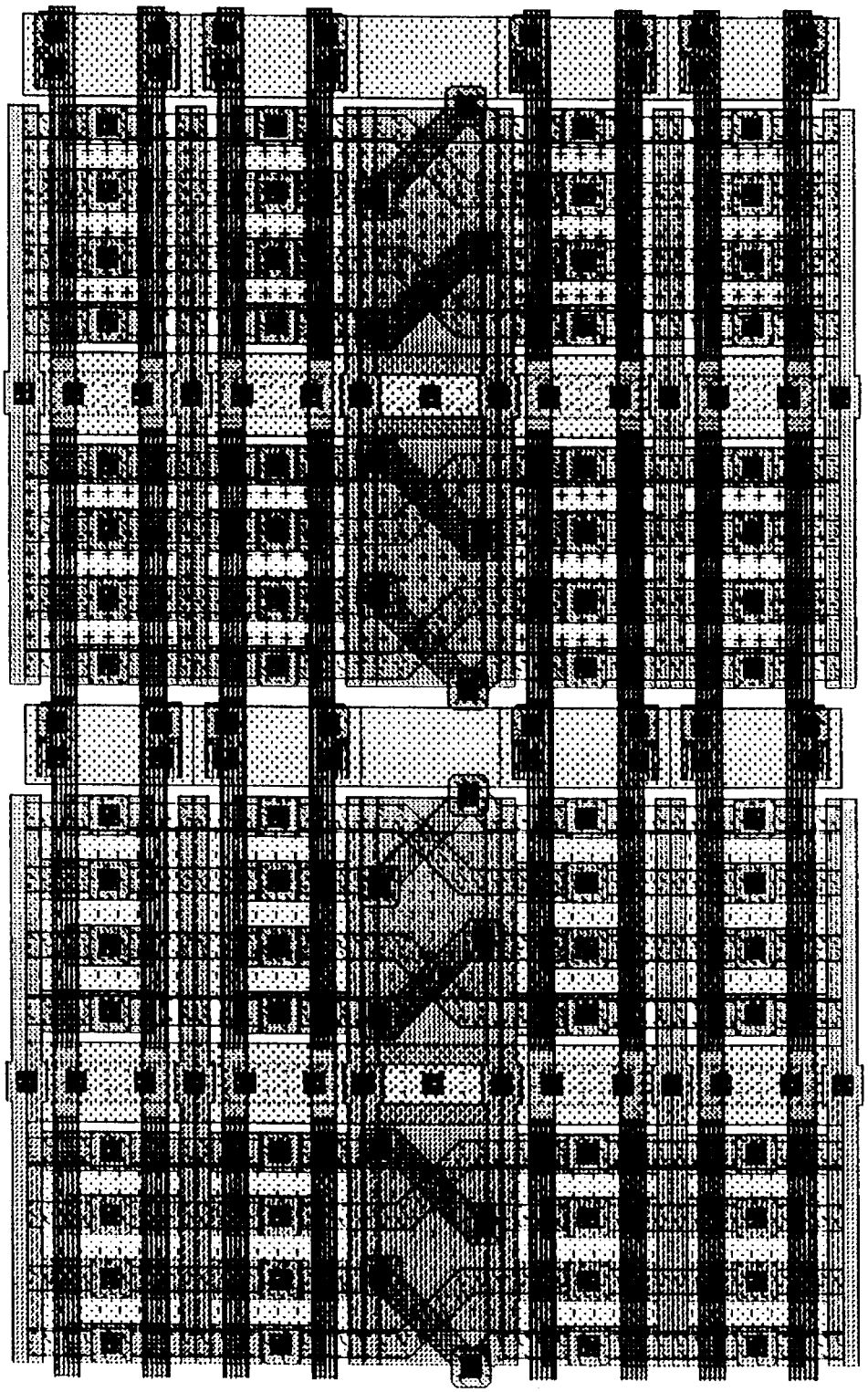
Figure 10D:
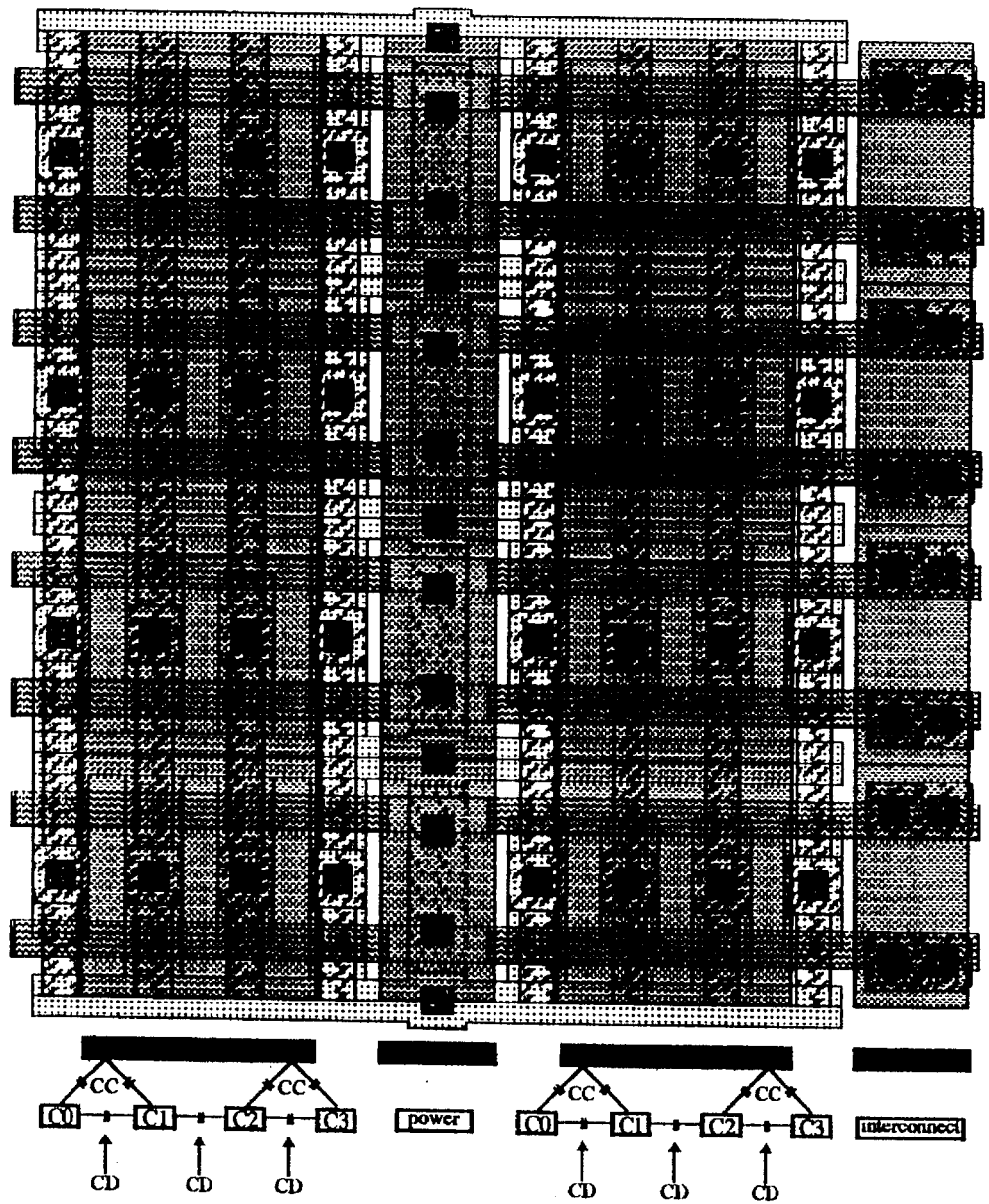

FIGS. 10a–c show the layout of some cells in ROM 300 with the vertical columns pairwise crossing in the center band of FIG. 10a to reduce differential coupling capacitances. Also, the horizontal row lines in FIG. 10a are periodically tapped to connect to the gates of groups of eight cells which are either transistors or not according to programming. This periodic tapping of the row line lessens the RC time constant across the row. And FIG. 10d is a plan view plus cross sectional elevation view showing the first and third metal levels. The power and data run in third level metal above the columns. The capacitance from the columns to power lines is labelled CC and contributed to the common mode coupling. The capacitance from column to column is labelled CD and contributes to the differential coupling. Placing the power lines in third level metal above the columns reduces the value of CD while increasing the common mode coupling to the power supply with the addition of CC. Also, the third level metal protects the columns from irregularities in coupling introduced by plastic packaging.

Figure 12:
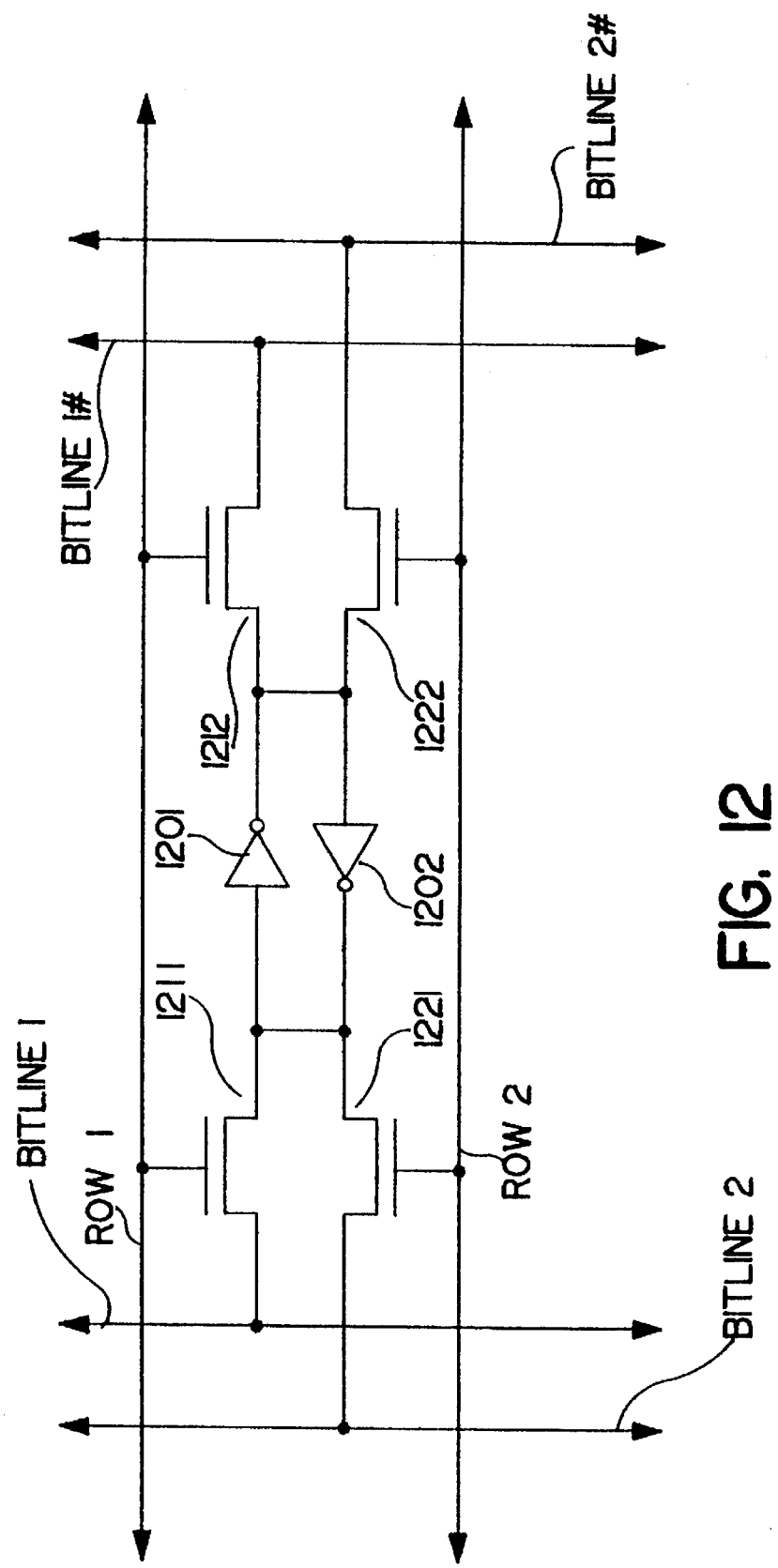
FIG. 12 illustrates a memory cell of preferred embodiment RAM.

FIG. 11 schematically shows preferred embodiment dual port RAM 1100 as including memory cell array 1102 row, address decoder 1104, column precharger 1106, read multiplexer 1110, sense amplifiers 1112, output drivers 1114, write multiplexer 1120, input data latch 1122, and control 1130. The clock input synchronizes reads and writes for RAM 1100. RAM 1100 has two ports. One port supports the functions read and write, while the other port supports the function read. Memory cell array 1102 is arranged into rows and columns, and n-bit words may be written and read in parallel where n is a the ratio of the number of columns divided by the multiplexing ratio of multiplexers 1110 and 1120. FIG. 12 shows a single memory cell as a latch (cross coupled inverters 1201–1202) with the two nodes connected to the Bitline1 and Bitline1# through pass transistors 1211–1212 controlled by Row1, and the two nodes also connected to Bitline2 and Bitline2# through pass transistors controlled by Row2. Bitline1 and its complement Bitline1# form the first port and Bitline2 and its complement Bitline2# form the second port. The choice between wordlines Row1 and Row2 determines which port is accessed. Because n-bit words can be read, low power sense amplifiers must be used due to all of the sense amplifiers being simultaneously active.

Figure 13:
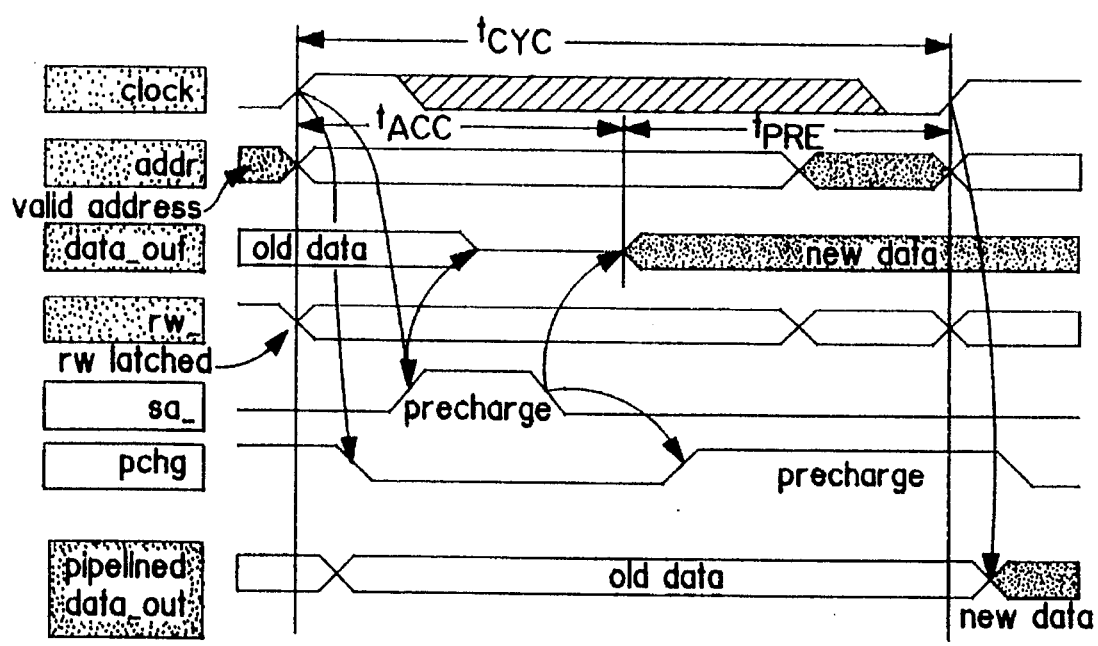
FIGS. 13–15 are dual port RAM timing diagrams.

FIG. 13 is a timing diagram for a read cycle in RAM 1100. The top panel shows the clock with a rising clock edge starting the cycle; note that the falling clock edge does not trigger anything and thus the clock duty cycle need not be carefully controlled. In the read cycle the precharge of the sense amplifier (fifth panel) takes place during the first part of the evaluation portion of the cycle, but after evaluation internal logic initiates precharge of the remainder of the memory for the following cycle. RAM 1100 stays in precharge until the clock initiates another cycle. This cycle does not require the user to massage the memory clock's duty cycle to optimize the precharge and evaluation portions for performance. The user only supplies one clock edge to initiate a cycle, then the rest of the cycle in internally synchronized. Consequently the user can achieve maximum performance from RAM 1100 by increasing the clock frequency to the minimum cycle time. Since the precharge extends into the following cycle it turns out that the access time and cycle time are close to being the same.

To support pipelined architectures the address (second panel) and read/write control line (fourth panel) are latched at the start of a cycle. The hold time on these controls is zero. RAM 1100 supports both buffered and pipelined data output. The signal "data_out" in the third panel shows the new data as it would appear with the buffered option. The signal "pipelined data_out" in the bottom panel shows the data as it would appear with the pipelined option. With a pipelined output the data is available during the entire cycle following an access.

Several problems are solved by this read cycle. Most importantly, the memory can use the system clock, thus eliminating delays between the clock and memory clock. Setup and hold times can thus be achieved with less difficulty. The user can now achieve optimum performance from the memory without adjusting the duty cycle of the memory clock to achieve optimal precharge and evaluation times. Bus hold devices are not required on the outputs since the data output lines are tri-stated for a short time and the tri-state is not related to the memory clock duty cycle. The power consumption is reduced since the evaluation operation is self timed to be only as long as necessary limiting the voltage swing on the columns.

Figure 14:
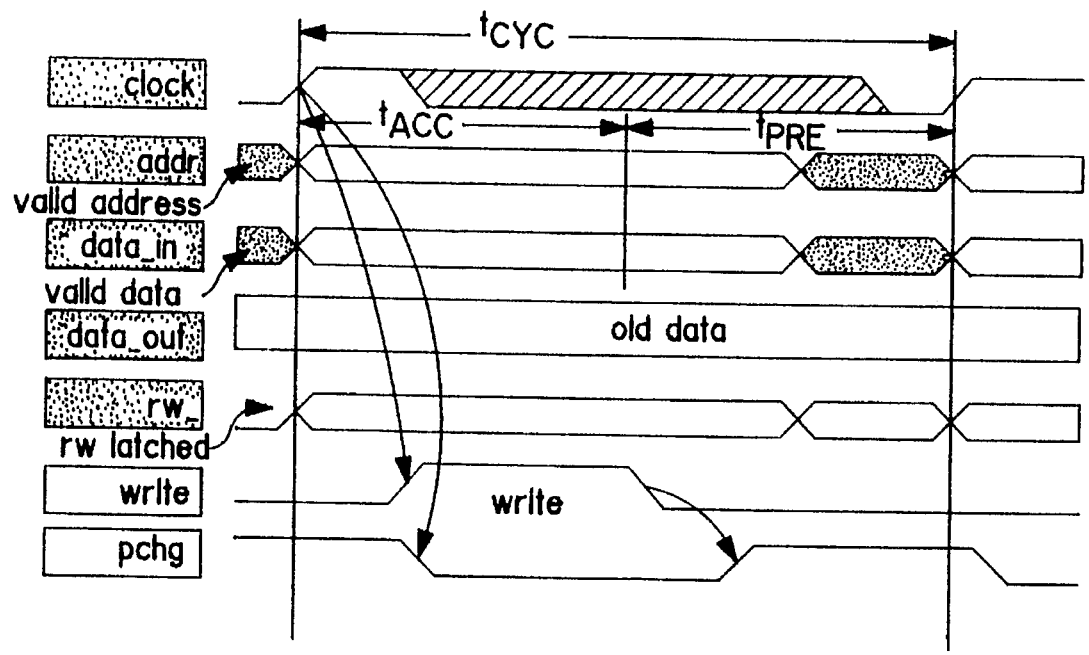

The write cycle in FIG. 14 is modified to support pipelined architectures. Note that in addition to the address and read/write control, the input data is latched at the start of the access portion of the cycle. Since no bus hold devices are present the output data is held during the entire write cycle. Input data is latched to support pipelined designs. The input data latch allows the user to treat the memory as a pipeline stage where the data to be written to memory is set up prior to the rising edge of clock and written after rising edge of clock. Since the data written is not modified, this cycle shown in FIG. 15 can be called a read-write cycle.

Figure 15:
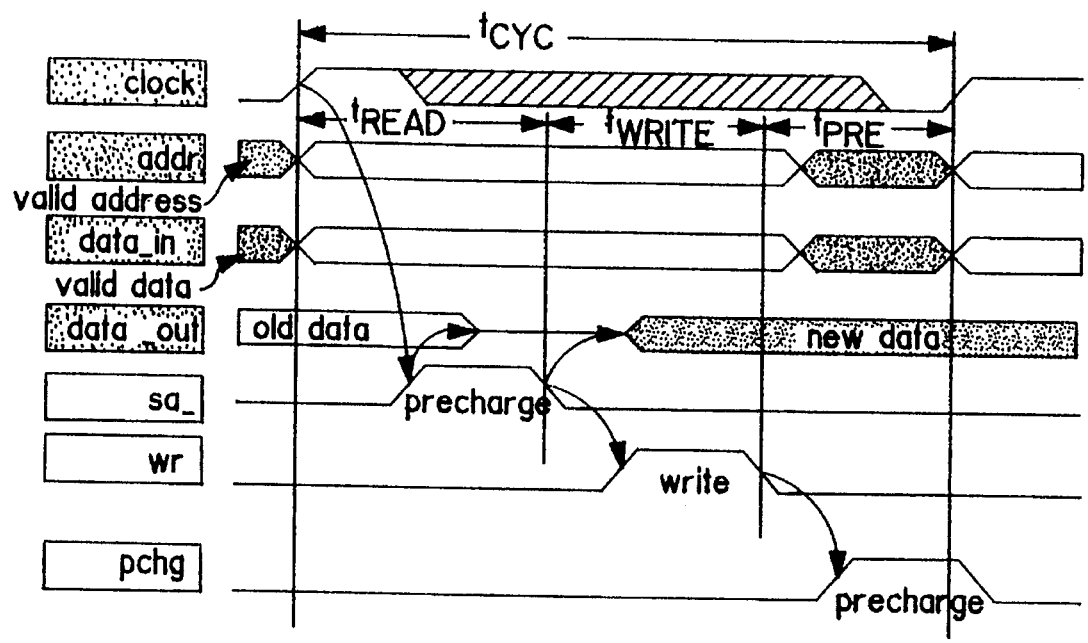

The read-write cycle starts with clock then with a precharge of the sense amplifier (fifth panel of FIG. 15). When the sense amplifier signal "SA#" goes low the read operation is finished and internal logic initiates the write operation. When the write operation is completed internal logic initiates the precharge of logic other than the sense amplifier. The memory remains in the precharge operation until the clock initiates another cycle. A read-write cycle has use in storage of data samples for a digital filter where a filter computation uses a value read from memory and then this value is replaced with a more current value.

Figure 16:
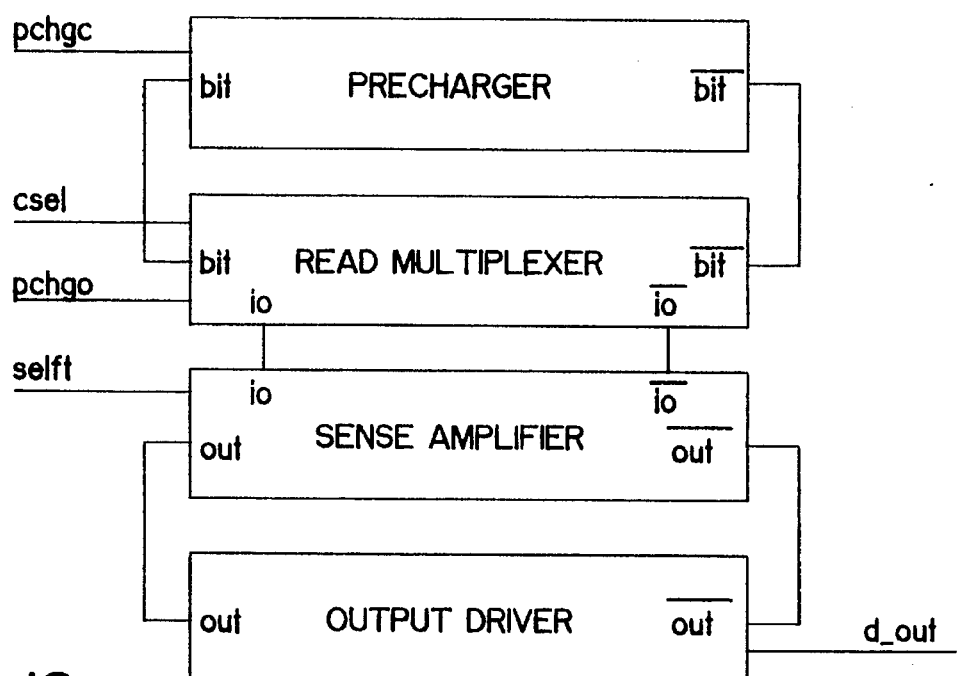
FIG. 16 is a block diagram of the read circuitry of the preferred embodiment RAM.
Figure 17:
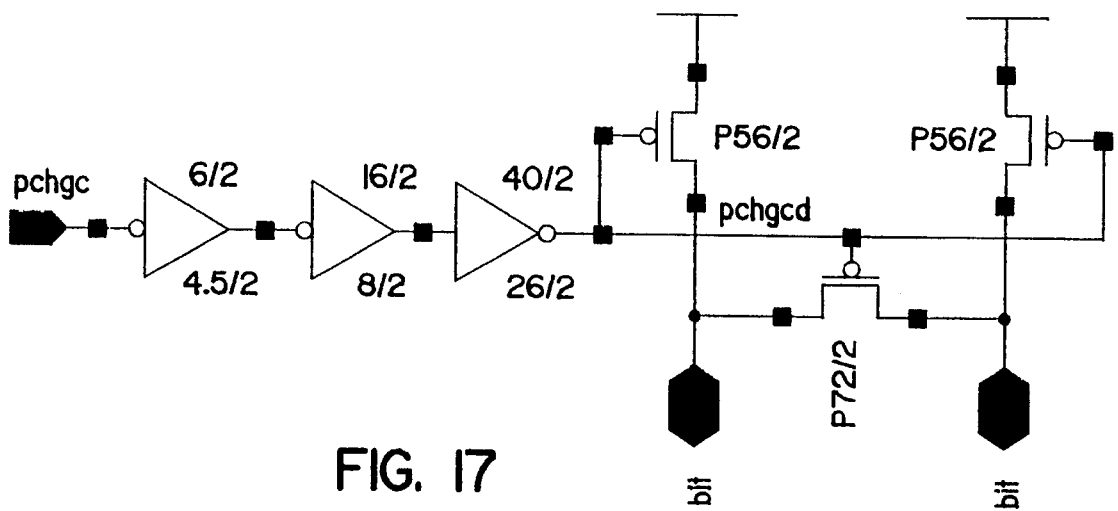
FIG. 17–20 are schematic circuit diagrams of the read circuitry.
Figure 18:
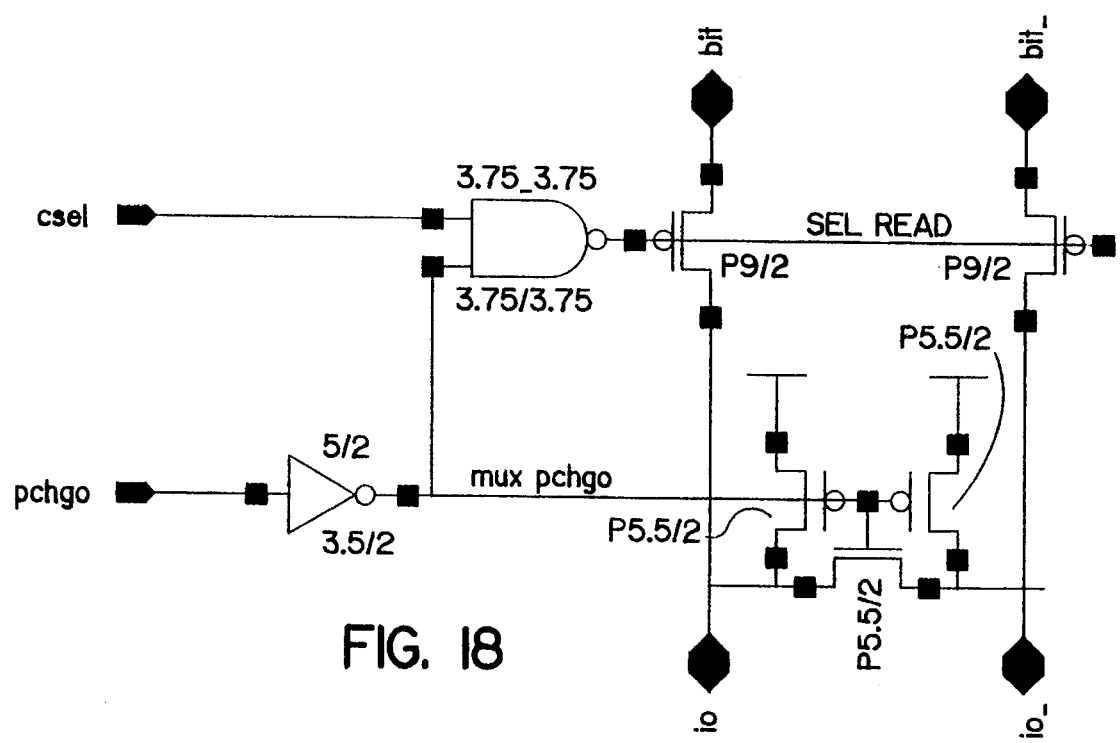

The blocks that compose the read circuitry are shown in FIG. 16. The precharger pulls the bit and bit# lines (which may be either Bitline1 and Bitline1# or Bitline2 and Bitline2# for the dual port RAM) to Vdd with PMOS devices. The read multiplexer is separate from the write multiplexer. The read multiplexer must be made of PMOS devices to pass the differential since bit and bit# are precharged to the Vdd voltage rail. The read multiplexer is precharged when the sense amplifier is turned on. From 2 to $2^n$ where n is less than 5 read multiplexers can combine their output onto the IO and IO# lines coming into the sense amplifier. The sense amplifier is precharged when "selft" is high and evaluated when "selft" is low. The output driver can be a single ended driver or a register for pipelined applications. The following functions are supported by the read logic configuration.

(i) Data latching in the sense amplifier. When the sense amplifier is turned on, a differential exists on the io and io# inputs. The sense amplifier settles into a "one" or a "zero" state.

(ii) Read multiplexer output precharging while data remains latched in the sense amplifier. This is possible since the read multiplexer output is precharged high, and a high on the sense amplifier input lines io and io# leaves the cross coupled notes "int" and "int_" in the sense amplifier latched.

(iii) Read multiplexer isolation of the sense amplifier during a write cycle. If the write value were allowed to reach the sense amplifier the latched data could be lost. Since both a read and write multiplexer are used, the read multiplexer is turned off during a write operation. During a write operation the sense amplifier only sees the precharge of the read multiplier output and remains latched for the whole write cycle.

(iv) Sense amplifier being left on during all times except sense amplifier precharge. Since the precharge of the read multiplexer output and write operation do not destroy the data latched internal to the sense amplifier it is possible to leave the sense amplifier on during all time except the brief precharge of the sense amplifier that occurs after a read cycle is initiated.

(v) Buffered Data Output Driver is tri-stated during precharge of the sense amplifier. The output driver is made so that when the sense amplifier is precharged that both the NMOS and PMOS output devices are turned off, resulting in a tri-state condition on the data output driver. When the sense amplifier is turned on after precharge only one of the output devices is turned on. Consequently at no time are both the NMOS and PMOS data output devices turned on together to generate a current spike.

Figure 19:
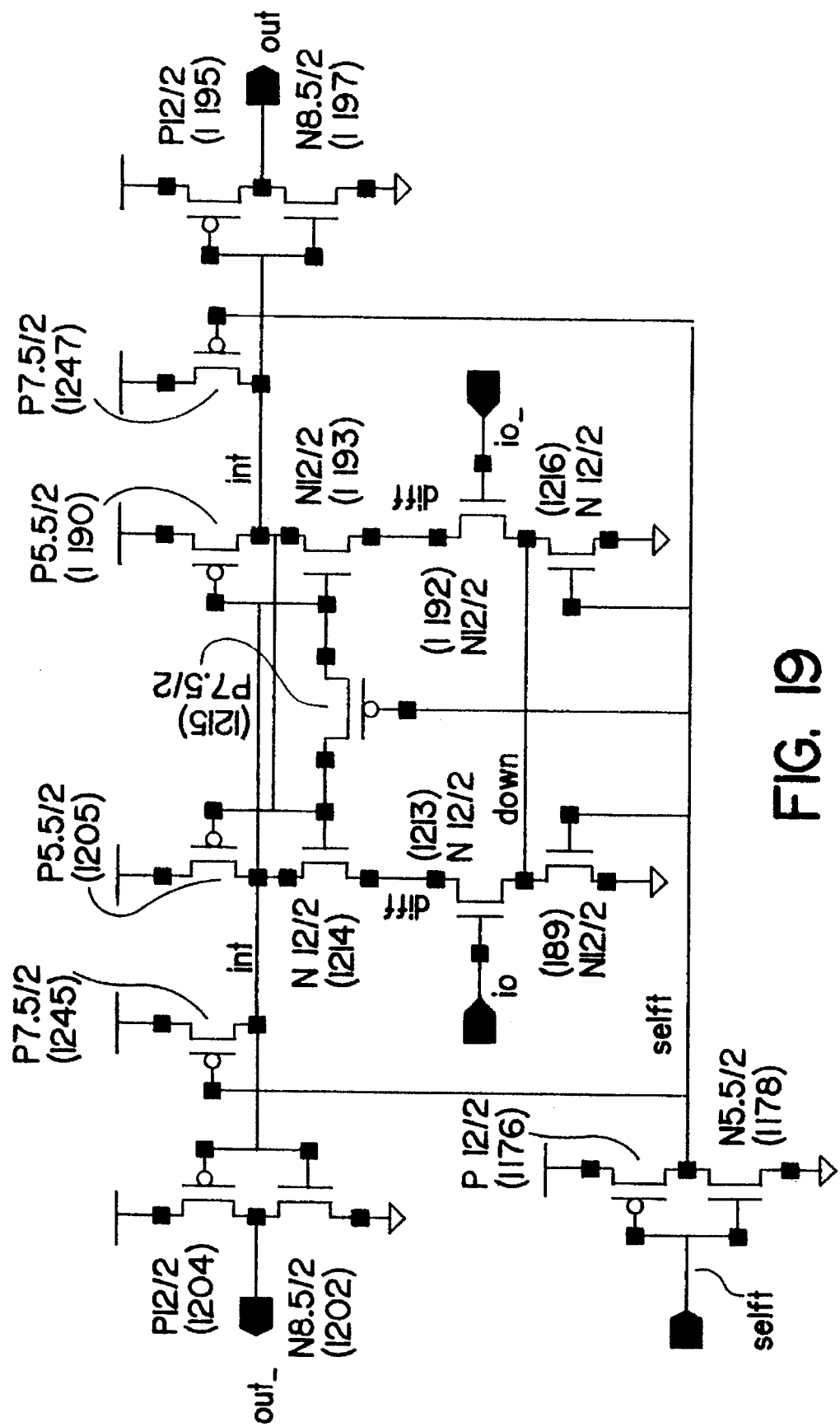
Figure 20:
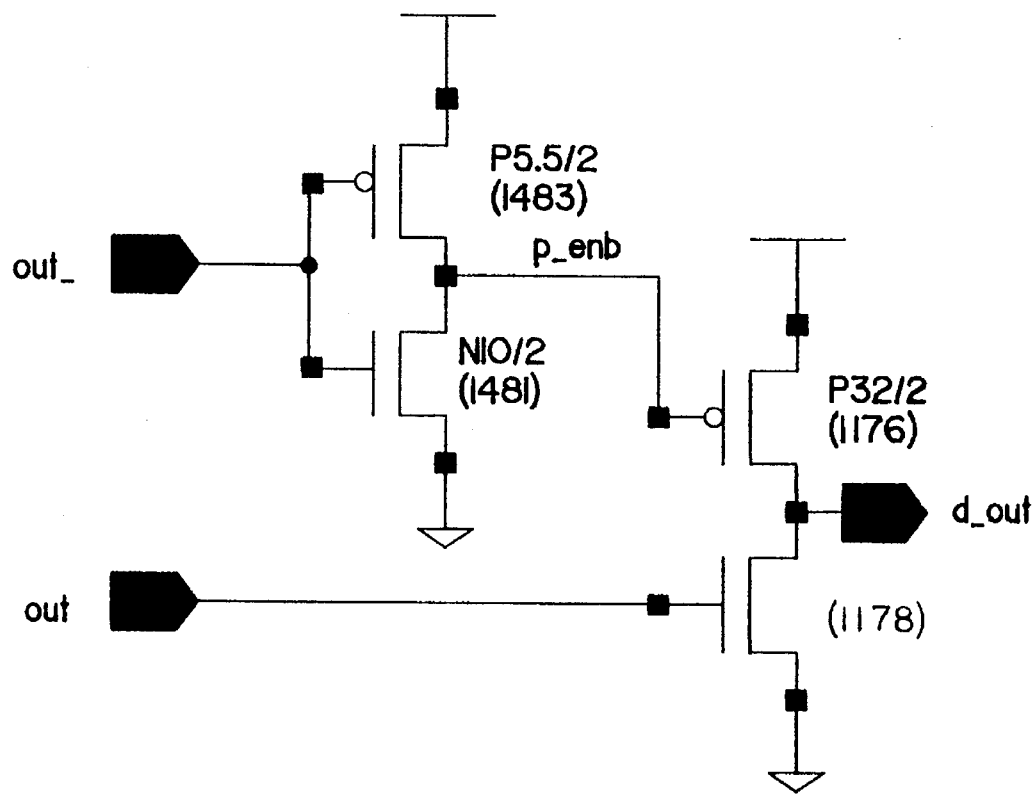

The schematics that compose the blocks of the read logic are shown in FIGS. 17–20. Note that FIGS. 19 and 20 are similar to FIGS. 6a–b for ROM 300.

Figure 21:
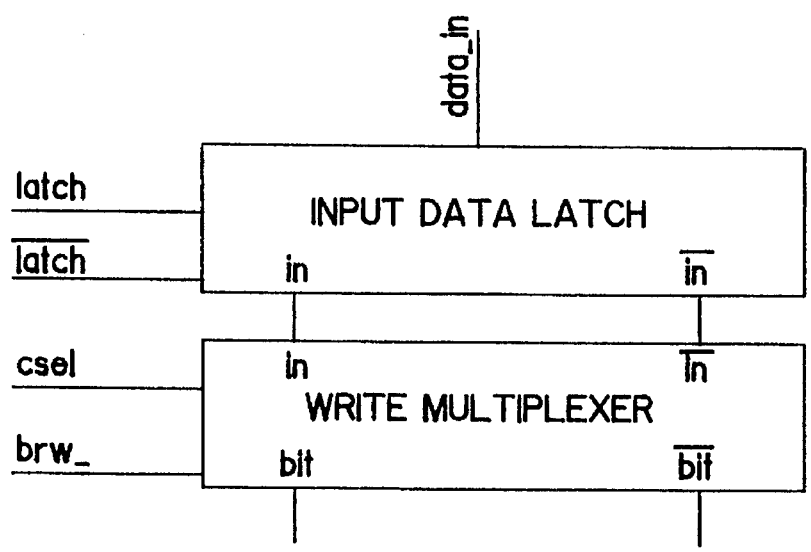
FIG. 21 is a schematic diagram of the write circuitry of the preferred embodiment RAM.

Write Circuitry. The blocks that compose the write circuitry are shown in FIG. 21. Data comes into the input data latch in a single ended fashion. The data is latched with the latch and latch# control lines. The differential output from the input data latch drives from 2 to $2^n$ where n is an integer less than 5 write multiplexers. The write multiplexer is composed of NMOS devices.

The following functions that are supported by the write logic configuration.

(i) Write operation while read logic is isolated. A separate write multiplexer allows this to happen.

(ii) NMOS write multiplexing. With NMOS pass transistors on the memory cell an NMOS write multiplexer is necessary.

(iii) The Write and Read logic can be placed on the same or opposite side of memory array. These write and read blocks can be placed on opposite sides of the memory array since they do not share any logic except the data columns.

(iv) Ability to write one value and flip it to the other value during the same write cycle. The user can elect to leave the data latch open during a write cycle. During this type of write the write logic is able to flip the memory cell any number of times until the write control terminates the write cycle. This ability is possible since the NMOS multiplexer is driven by an inverter rather than an NMOS transistor.

Figure 22:
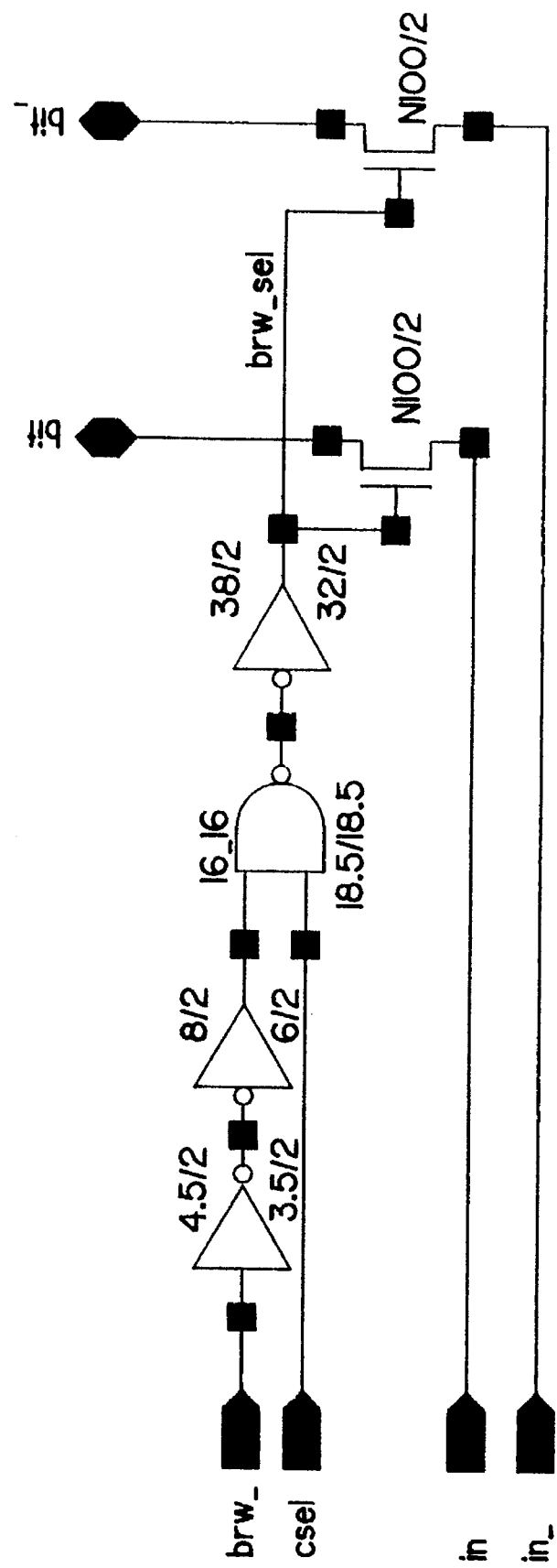
FIG. 22–23 are schematic circuit diagrams of the write circuitry.
Figure 23:
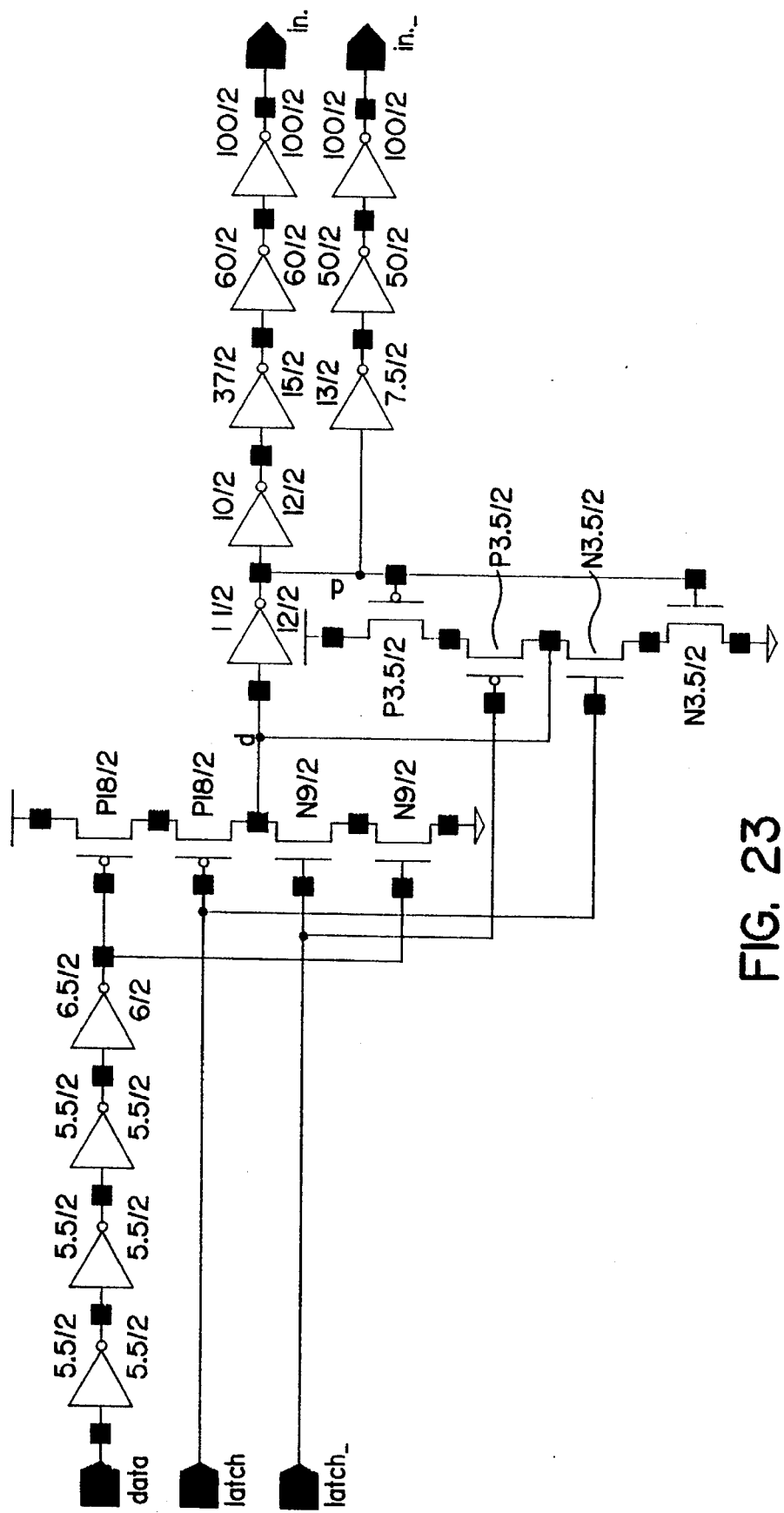

The schematics that compose the blocks of the write logic are shown in FIGS. 22–23.

The dual port cell of FIG. 12 is made of eight transistors (two in each inverter 1201 and 1202 and the four pass transistors 1211, 1212, 1221, and 1222) and thus is called an 8T cell. An 8T cell is more susceptible to column cross-coupling than its single port 6T counterpart. This results from having two ports adjacent to each other in metal. Cross-coupling can occur between the two ports of the same bit or between columns of adjacent bits. Noise can be coupled in from the power rails with an 8T cell more easily than with its 6T counterpart.

Figure 24:
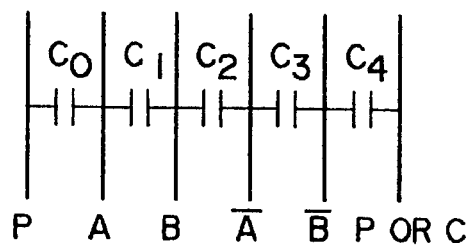
FIG. 24–27 illustrate column arrangements.
Figure 25:
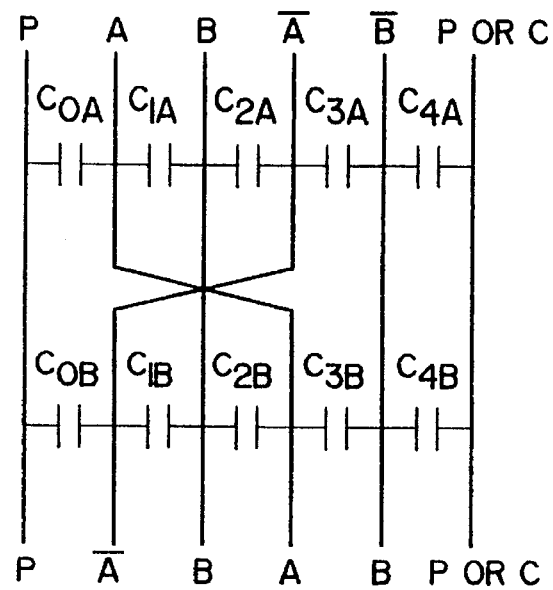

The 8T cell can be implemented many ways. The most efficient way results in a column structure as shown in FIG. 24. In this configuration the two ports bitlines A, A# and B, B# are interleaved with each other. The Power rails (P) can run on both sides of the memory cells. Alternately one of the power lines can be replaced with a column C from an adjacent cell. Capacitors $C_0$–$C_4$ are cross-coupling between columns. If port A writes a zero the bitline A will make a rail to rail transition. This will couple into bitline B only. If port A writes a one bitline A# will couple into bitline B and B# equally. The first approximation solution for this problem is to cross the columns in an effort to distribute the coupling in a common mode fashion rather than in a differential fashion. FIG. 25 shows a crossover of port A. On a 6T RAM or a ROM where bit to bit cross-coupling is not involved, two such crossovers are required for complete balancing. The crossovers are to be placed approximately ¼ and ¾ of the way up the array.

Figure 26:
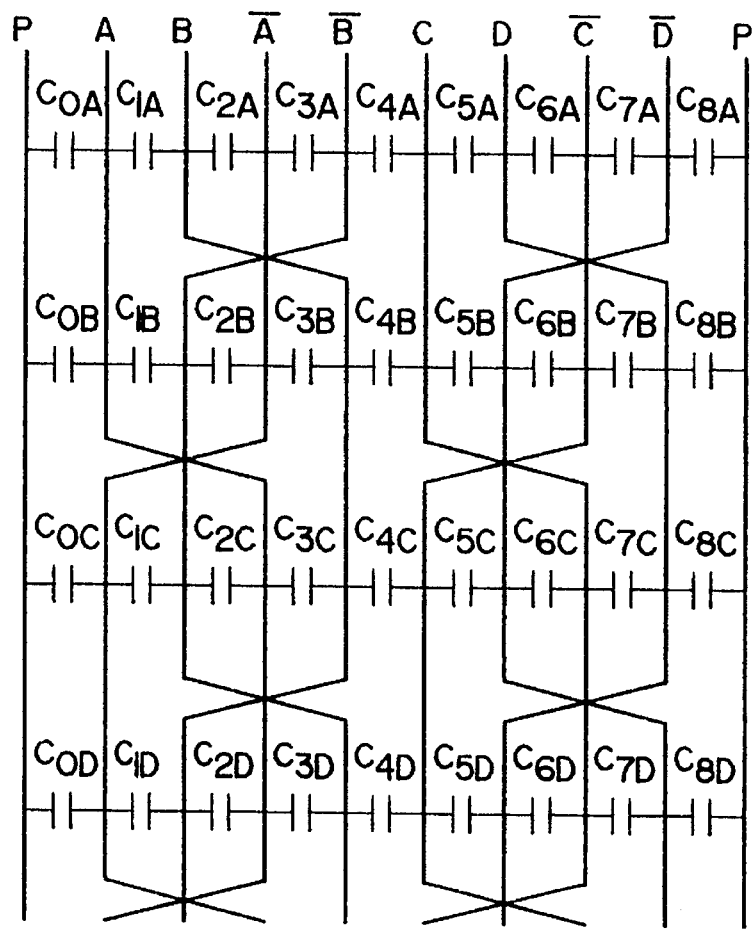

On the 8T cell RAM 1100 four such crossovers are required for complete balancing. This is shown in FIG. 26. The crossovers are to placed approximately ⅛, ⅜, ⅝, and ⅞ of the way up the array.

The benefits and difficulties of crossing columns are as follows.

(i) Signals such as adjacent ports, bits, over the cell routes and power supply lines are converted from differential coupling to common mode coupling.

(ii) The 8T cell is very hard to balance internally. With the column crossing scheme internal balancing is not required. Consequently column lines can be reduced in capacitance. Allowing internal asymmetry allows capacitance to be removed from the word select line.

(iii) Conversion of differential noise to common noise does not occur instantaneously but most propagate along the wire for some length before conversion occurs.

Figure 27:
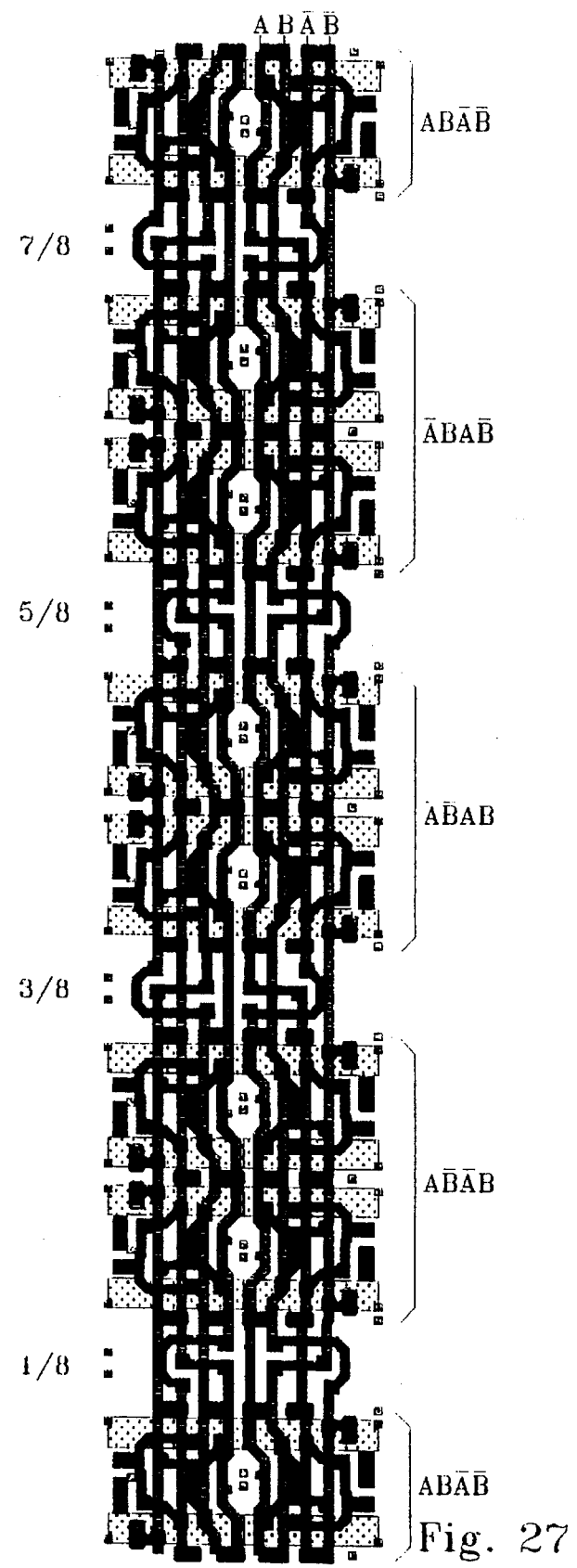

FIG. 27 shows the layout in more detail for a section of the array with the ⅛, ⅜, ⅝, and ⅞ array crossing areas designated. Also, the notations along the righthand side of the array section denote the A, A#, B, and B# order in each of these sections of the array.

Figure 28:
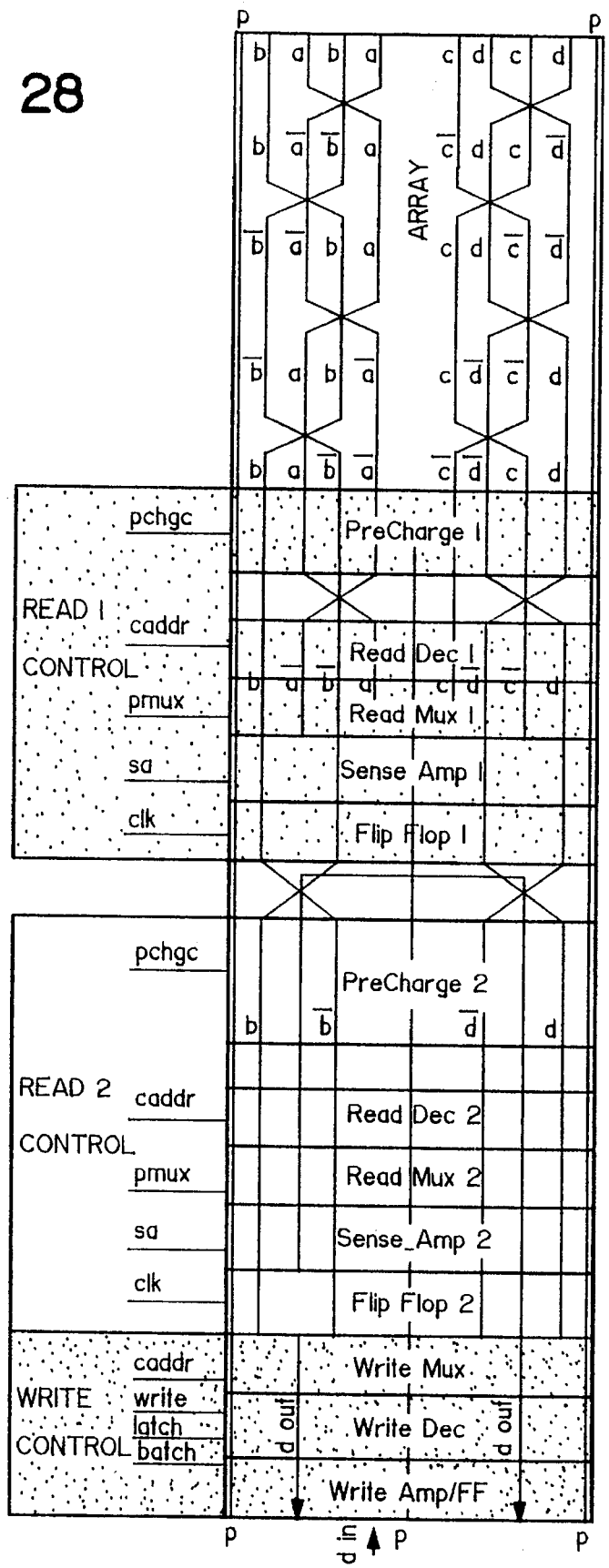
FIG. 28 shows column crossings for both memory array and read/write claim logic.

The column lines must be balanced for capacitance, in addition, differential noise must be converted to common mode noise. Noise comes in three varieties: rail to rail signal noise, power supply noise, and differential signal noise. The column arrangement illustrated schematically in FIG. 28 balances capacitance and reduces differential noise in both the memory array and column logic. In particular, the top section of FIG. 28 shows array balancing with four crossovers. Symmetric capacitance, read/write/power noise is converted to common mode noise by the crossovers. Power is labelled P and runs in second level metal. Third level metal crosstraps the second level metal power lines. The upper middle portion of FIG. 28 shows logic for read port 1 with its precharger having the same length second level metal as its decoder/multiplexer. Consequently, power noise is coupled equally in the a,d lines as in the a#,d# lines except for the cross itself. Capacitance is balanced by the layout. The lower middle portion of FIG. 28 shows logic for read port 2 which balances capacitance with read port 1. The second level metal is not capacitively balanced. The balancing and noise rejection are a result of the second level metal lines being crossed between the two ports. Half the differential noise from reading port 1 is convened to common mode noise. This differential noise was considered preferable to rail to rail noise or power supply noise resulting from other designs. The bottom portion of FIG. 28 shows the write logic in which second level metal can be used freely. Power passes through the entire column logic in third level metal labelled p.

Figure 29:
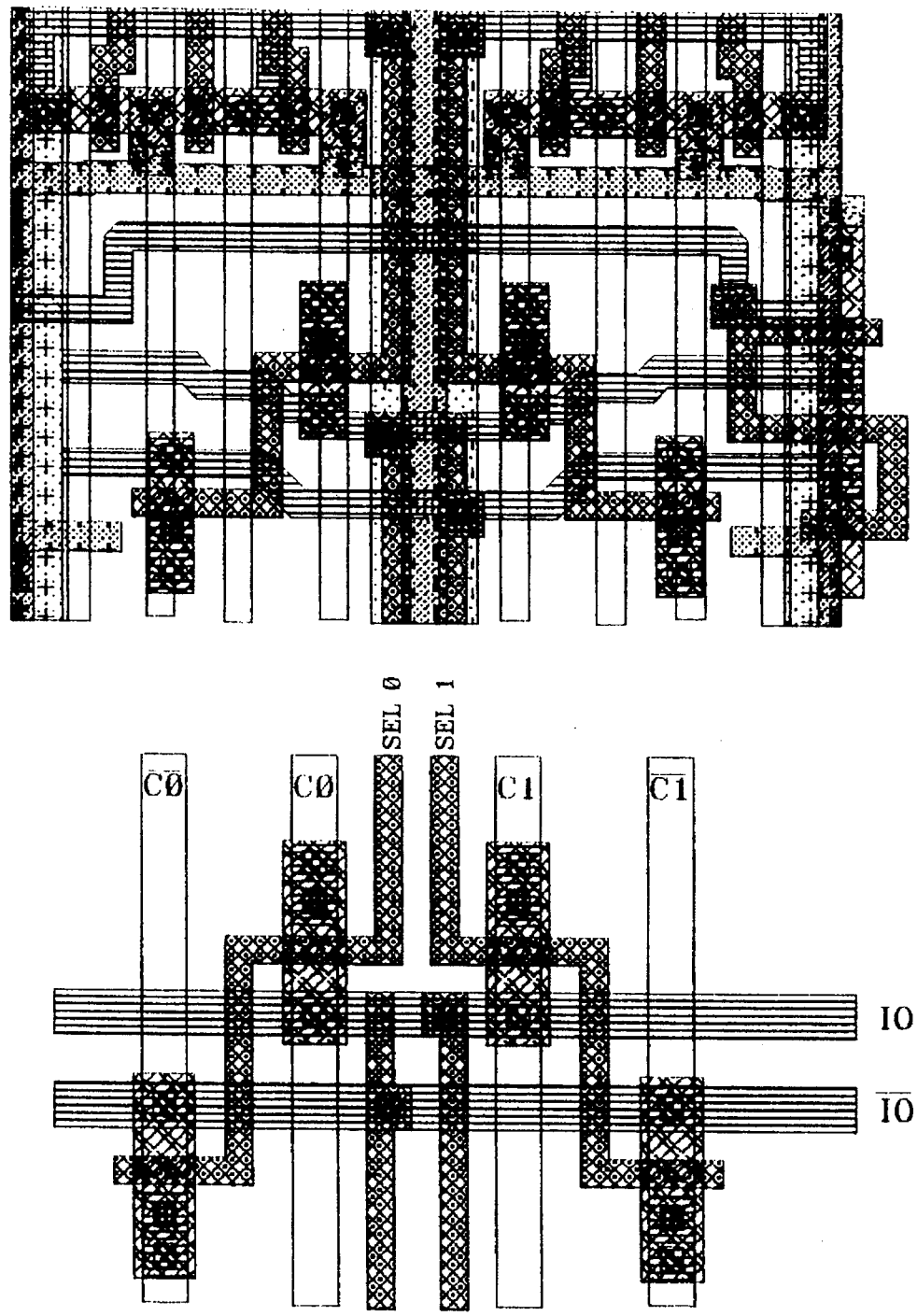
FIG. 29 illustrates the input/output multiplexer for the RAM.

The read multiplexer layout is important in preserving the symmetry for inputs to the sense amplifier. FIG. 29 shows a portion of the multiplexer. At the bottom of FIG. 29 a sketch shows the devices more clearly. Note that all columns completely intersect both IO and IO#. Also all devices are identical in shape. The select lines have similar coupling to both columns and IO and IO# lines. The polysilicon level output of the multiplexer is made of the same shape and crosses both IO and IO# lines. Consequently, IO and IO# should have the same capacitance and coupling. Such symmetry cannot be achieved with a multiplexer where devices share heads and columns are bent into the multiplexer.

FURTHER MODIFICATIONS AND VARIATIONS

The preferred embodiments may be varied in many ways while retaining features such as differential ROM sensing, selftimed RAM cycles, and dula port RAM column permutations for balanced capacitive coupling. For example, the cycle timing and column crossing of dual port RAM 1100 could each be applied to single port or multiport RAMs. In the case of RAMs with three or more ports, more complex column crossings occur as the number of sections of subdivision increases exponentially.

What is claimed:

1. A method of operating a memory having a clock input and memory cells by cyclically accessing and precharging the memory, the method comprising the steps of:
   (a) triggering a memory access phase with a first direction transition of the clock input, the memory access phase comprising a read portion and a write portion, wherein the read portion comprises the step of strobing a sense amplifier coupled to the memory cells, and the write portion commences after the sense amplifier has been strobed;
   (b) commencing a memory precharge phase after termination of the memory access phase; and
   (c) terminating the memory precharge phase after another first direction transition of the clock input so that the memory precharge phase extends into the next memory access phase.

2. The method of claim 1 wherein further comprising the step of terminating the write portion independent of the clock input.

3. A method of operating a memory in a pipeline memory system having a clock input and memory cells by cyclically accessing and precharging the memory, the method comprising the steps of:
   (a) triggering a memory access phase with a first direction transition of the clock input;
   (b) commencing a memory precharge phase after termination of the memory access phase;
   (c) terminating the memory precharge phase after another first direction transition of the clock input so that the memory precharge phase extends into the next memory access phase; and
   (d) providing data output following the another first direction transition until after a next first direction transition of the another first direction transition.

4. The method of claim 3 wherein the step of commencing the memory precharge phase is a function of strobing a sense amplifier coupled to the memory cells.

5. The method of claim 3 wherein the memory access phase comprises a read portion and a write portion, and further comprising the step of self-timing the write portion by the memory, where the timing is independent of the clock input.

6. A method of operating a memory having a clock input and memory cells by cyclically accessing and precharging the memory, the method comprising the steps of:
   (a) triggering a memory write phase with a first direction transition of the clock input;
   (b) commencing a memory precharge phase after termination of the memory write phase as a function of termination of the memory write phase; and
   (c) terminating the memory precharge phase after another first direction transition of the clock input so that the memory precharge phase extends into the next memory write phase.

7. The method of claim 6 further comprising the step of terminating the memory write phase independent of the clock input.

8. The method of claim 7 further comprising the step of self-timing the write portion by the memory.

9. A method of operating a memory having a clock input and memory cells by cyclically accessing and precharging the memory, the method comprising the steps of:
   (a) triggering a memory access phase with a first direction transition of the clock input;
   (b) commencing a memory precharge phase after termination of the memory access phase as a function of strobing a sense amplifier coupled to the memory cells; and
   (c) terminating the memory precharge phase after another first direction transition of the clock input so that the memory precharge phase extends into the next memory access phase.

10. The method of claim 9 operating in a pipeline memory system and further comprising the step of providing data output following the another first direction transition until after a next first direction transition of the another first direction transition.

11. The method of claim 10 operating in a buffered memory system and further comprising the step of providing data output following the start of the strobing of the sense amplifier and continuing the data output until after start of precharging of the sense amplifier in the following memory access phase.

12. The method of claim 9 wherein the memory access phase comprises a read portion and a write portion, and the read portion comprises the step of strobing the sense amplifier, and the write portion commences after the sense amplifier has been strobed.

13. The method of claim 12 further comprising the step of terminating the write portion independent of the clock input.

14. The method of claim 13 further comprising the step of self-timing the write portion by the memory.

15. A memory, comprising:

a clock input;

an array of memory cells arranged in rows and columns;

a sense amplifier coupled to a column of said cells; and timing circuitry triggered by a first direction transition of said clock input, said timing circuitry for terminating a first precharge of said array and for driving a first precharge of said sense amplifier when triggered by said first direction transition, and after said first precharge of said sense amplifier is complete strobing said sense amplifier, for driving a second precharge of said array until after another said first direction transition at said clock input.

16. The memory of claim 15 in a pipeline memory system and wherein said timing circuitry initiates data output upon a subsequent first direction transition.

17. The memory of claim 15 in a buffered memory system and wherein said timing circuitry initiates data output after said strobing of said sense amplifier and before commencement of said second array precharge.

18. The memory of claim 15 wherein said timing circuitry initiates a write operation after said strobing of said sense amplifier and before said second array precharge.

19. The memory of claim 15 wherein said timing circuitry is not affected by a second direction transition of said clock input that is opposite said first direction transition.

20. The memory of claim 15 wherein said sense amplifier comprises a pair of cross coupled inverters, and a transistor for driving both said inverters, whereby both inverters are driven to equal precharge levels.

* * * * *